United States Patent
Subramony et al.

(12) 
(10) Patent No.: US 6,713,127 B2
(45) Date of Patent: Mar. 30, 2004

(54) METHODS FOR SILICON OXIDE AND OXYNITRIDE DEPOSITION USING SINGLE WAFER LOW PRESSURE CVD

(75) Inventors: Janardhanan Anand Subramony, Santa Clara, CA (US); Yoshitaka Yokota, San Jose, CA (US); Ramaseshan Suryanarayanan Iyer, Santa Clara, CA (US); Lee Luo, Fremont, CA (US); Aihua Chen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/041,026

(22) Filed: Dec. 28, 2001

(65) Prior Publication Data

US 2003/0138562 A1 Jul. 24, 2003

(51) Int. Cl.$^7$ ................................................ C23C 16/40
(52) U.S. Cl. ........................ 427/255.37; 427/255.393; 427/255.394
(58) Field of Search ................ 427/255.37, 255.393, 427/255.394; 438/787, 790

(56) References Cited

PUBLICATIONS

Watt, V.H.C., et al., "Direct Bonding of LPCVD Silicon Oxide Thin Film Films Deposited from N2O and SiH4," Electrochemical Society Proceedings, vol. 95–7, pp. 573–578.

*Primary Examiner*—Timothy Meeks
(74) *Attorney, Agent, or Firm*—Blakely Sokoloff Taylor & Zafman

(57) ABSTRACT

An oxide and an oxynitride films and their methods of fabrication are described. The oxide or the oxynitride film is grown on a substrate that is placed in a deposition chamber. A silicon source gas (or a silicon source gas with a nitridation source gas) and an oxidation source gas are decomposed in the deposition chamber using a thermal energy source. A silicon oxide (or an oxynitride) film is formed above the substrate wherein total pressure for the deposition chamber is maintained in the range of 50 Torr to 350 Torr and wherein a flow ratio for the silicon source gas (or the silicon source gas with the nitridiation source gas) and the oxidation source gas is in the range of 1:50 to 1:10000 during a deposition process.

10 Claims, 14 Drawing Sheets

METHODS FOR SILICON OXIDE AND OXYNITRIDE DEPOSITION USING SINGLE WAFER LOW PRESSURE CVD

BACKGROUND OF THE INVENTION

1. Field of the Invention

The present invention relates to the field of semiconductor integrated circuit manufacturing and more specifically to medium temperature deposition and high temperature deposition of silicon oxide films and methods of fabrication of these oxide films.

2. Discussion of Related Art

Chemical vapor deposited (CVD) $SiO_2$ films and their binary and ternary silicates (generally referred to as oxide films) have wide use in fabrication of integrated circuits such as microprocessors and memories. These films are used as insulation between polysilicon and metal layers, between metal layers in multilevel metal systems, as diffusion sources, as diffusion and implantation masks, as spacers, and as final passivation layers. Acceptable deposited oxide film processes provide uniform thickness and composition, low particulate and chemical contamination, good adhesion to the substrate, and high throughput for manufacturing.

These films are formed using well known techniques such as CVD. Low-pressure chemical vapor deposition (LPCVD) is a special case of a CVD process, typically used for front end of line (FEOL) dielectric film deposition. In a CVD process, a given composition and flow rate of reactant gases and diluent carrier gases are introduced into a reaction chamber. The gas species move to a substrate and the reactants are adsorbed on the substrate. The atoms undergo migration and film-forming chemical reactions and a film (e.g., silicon oxide) is deposited on the substrate. The gaseous byproducts of the reaction and removed from the reaction chamber. Energy to drive the reactions can be supplied by several methods, e.g. thermal, light and radio frequency, catalysis, or plasma. A conventional CVD system typically contain gas sources, gas feed lines, mass-flow controllers, a reaction chamber, a method for heating substrates onto which the film is to be deposited, and temperature sensors. A conventional LPCVD system is similar to the CVD system except that temperature is the primary driver for the reaction of source gases.

A state of the art system for forming a medium temperature deposition oxide film (MTO) and a high temperature deposition oxide film (HTO) on a substrate utilizes a batch type LPCVD system which is depicted in FIG. 1A. This figure illustrates a batch type LPCVD system 100 which is a hot wall furnace system including a three-zone resistance furnace 112, a quartz reactor tube 102, a gas inlet 104, a pressure sensor 106, and a wafer boat 108. A plurality of silicon wafers 110 are vertically positioned upon the wafer boat 108 for deposition. The wafers are radiantly heated by resistive heating coils surrounding the tube 102. Reactant gases are metered into one end of the tube 102 (gas inlet 104) using a mass flow controller. Reaction by-products are pumped out the other end of the tube 102 (e.g., via an exhaust pump).

The state of the art system suffers a disadvantage called "depletion effects." Depletion effects reduce gas phase concentrations as reactants are consumed by reactions on wafer surfaces. As such, wafers near the inlet 104 are exposed to higher concentrations of reactant gases. Deposition rates are thus greater for wafers placed near the inlet 104. As a result, uniform thickness is difficult to obtain for the wafers in a batch and from batch to batch.

SUMMARY OF THE INVENTION

A process for forming a silicon oxide film, or a silicon oxynitride film, is described. The film is grown by a thermal low-pressure chemical vapor deposition process. The process can be performed in a single wafer cold wall reactor wherein a silicon source gas and an oxidation source gas are decomposed using a thermal energy source in a deposition chamber to form the film. The film is formed with a total pressure between 50 to 350 Torr and with a flow ratio between 1:50 to 1:10000, silicon source gas flow to oxidation source gas flow, respectively. The process enables forming of films having thickness less than 100 Å and greater than 1000 Å with a deposition rate between 20 Å per minute to 2000 Å per minute.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE PRESENT INVENTION

The present invention is a novel method of forming a low temperature, medium temperature and high temperature silicon oxide, or silicon oxynitride film. In the following description, for purposes of explanation, numerous specific details are set forth in order to provide a thorough understanding of the present invention. It will be evident, however, to one skilled in the art, that the present invention may be practiced without these specific details. In other instances, specific apparatus structures and methods have not been described so as not to obscure the present invention. The following description and drawings are illustrative of the invention and are not to be construed as limiting the invention.

The following sections describe novel methods to deposit a low temperature, medium temperature, or high temperature film (e.g., silicon oxide and a silicon oxynitride film). The low temperature film is formed with a deposition temperature ranging from 300° C. to 600° C.; the medium temperature film is formed with a deposition temperature ranging from 600° C. to 800° C.; and, the high temperature film is formed with a deposition temperature ranging from 800° C. to 900° C. A thermal low-pressure chemical vapor deposition (LPCVD) process is used to form the silicon oxide film or the silicon oxynitride film. The process can be performed in a single wafer cold wall reactor wherein a silicon source gas and an oxidation source gas are decomposed using a thermal energy source in a deposition chamber to form the oxide film. The flow ratio of the silicon source gas to the oxidation source gas ranges from 1:50 to 1:10000, silicon source gas to oxidation source gas, respectively. The total pressure in the deposition chamber ranges from 50 to 350 Torr while forming the silicon oxide film. The process enables the formation of the silicon oxide film having thickness less than 100 Å or greater than 1000 Å, preferably between 10 Å to 3000 Å, and with a deposition rate between 20 Å per minute to 2000 Å per minute. The substrate having the oxide film deposited is optionally annealed using a rapid thermal annealing process using, preferably, the same oxidation source gas. The methods of forming the films according to the present invention can be integrated to form oxide-nitride (ON) spacer, oxide-nitride-oxide (ONO) spacer, ONO stack for flash memory gate, or liner oxide trench, or side wall spacer in a MOS transistor, to name a few.

Figure 1:
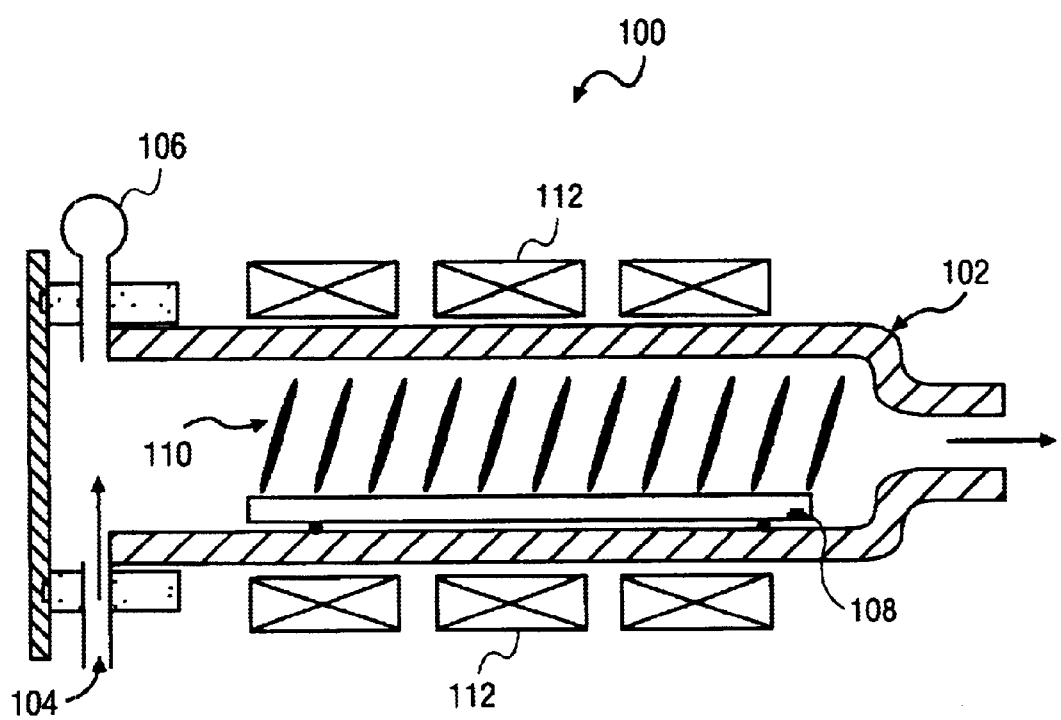
FIG. 1 is an illustration of an exemplary LPCVD system of the prior art.
Figure 2:
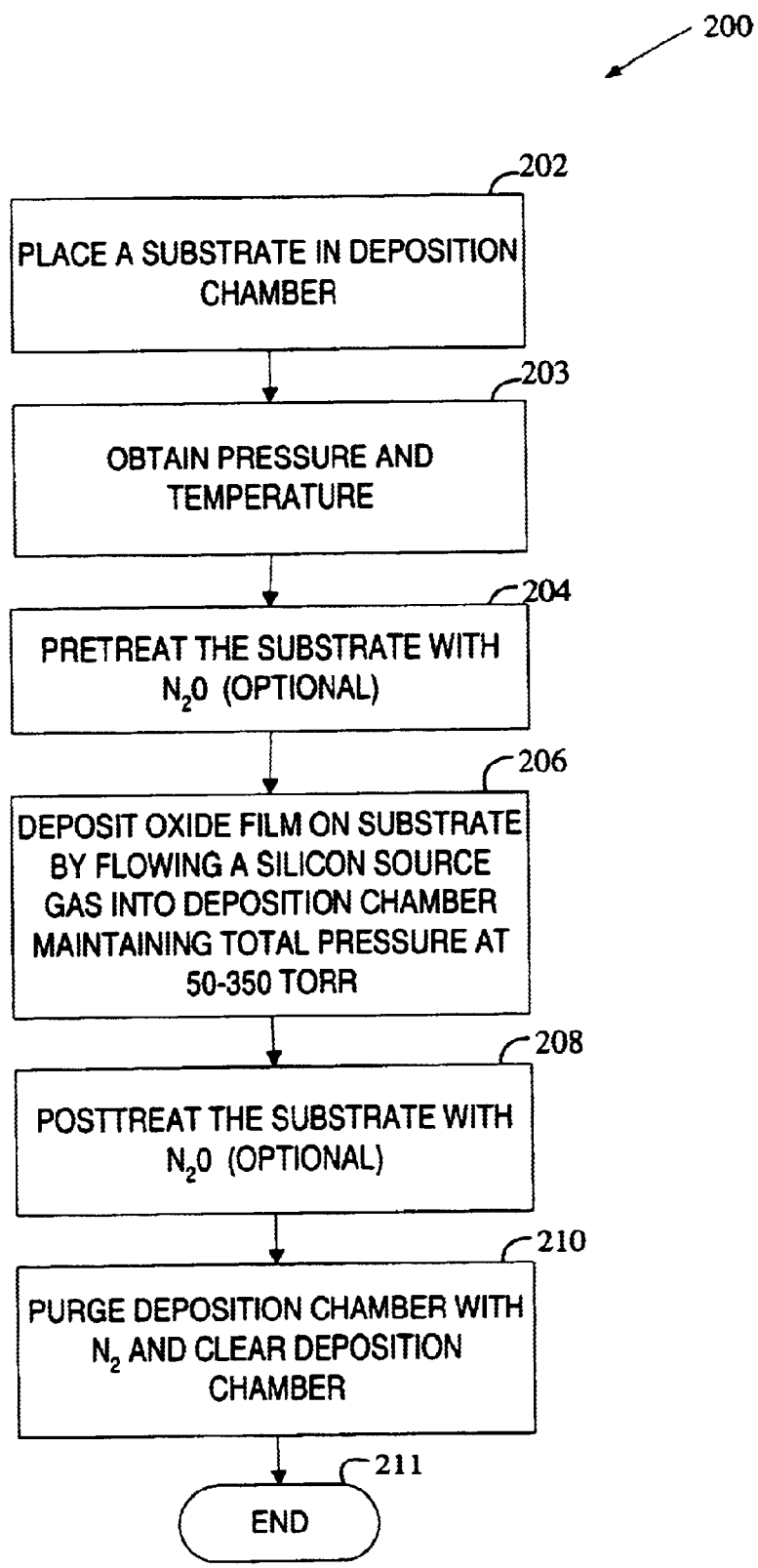
FIG. 2 shows a process flow which illustrates an exemplary method of the present invention of how the silicon oxide film is formed.

FIG. 2 illustrates the process flow of an exemplary method 200 for forming a silicon oxide film of the present invention. As set forth in step 202 of flow chart 200, the first step is to place a substrate 300 on which the silicon oxide film is to be formed in a deposition reactor. Substrate 300 is placed in a thermal LPCVD reactor which is suitable for depositing the silicon oxide film of the present invention. An example of a suitable thermal LPCVD apparatus is the resistively heated LPCVD reactor illustrated in FIGS. 4–6. Other suitable deposition reactors include the OxZgen™ reactor manufactured by Applied Materials, Inc. Prior to discussing the process of deposition, one exemplary thermal LPCVD apparatus 400 is described herein.

Figure 4:
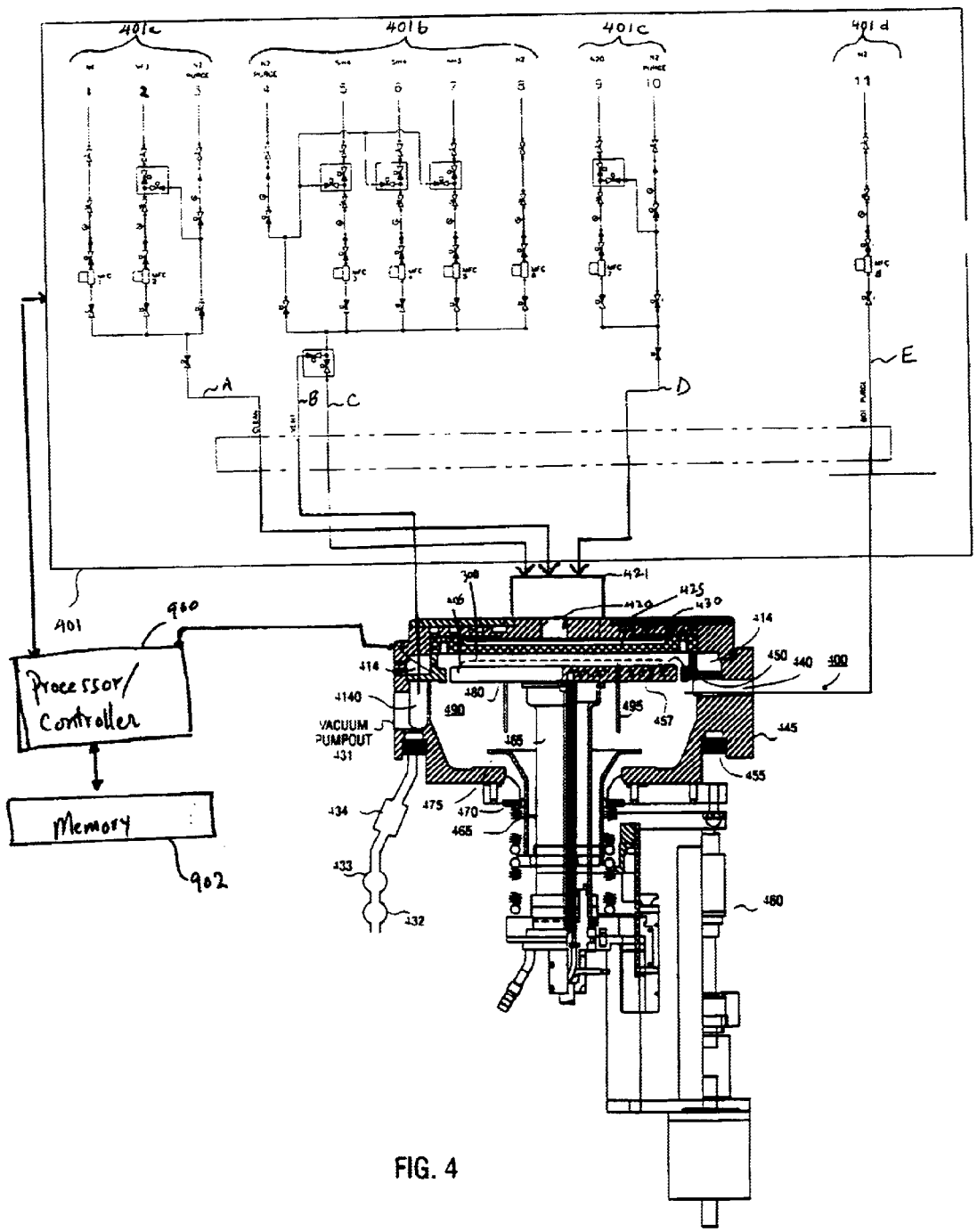
FIG. 4 shows an illustration of a cross-sectional sideview of an exemplary thermal low-pressure chemical vapor deposition processing chamber comprising a resistive heater in a "wafer process" position which can be used to form the silicon oxide film of the present invention.
Figure 5:
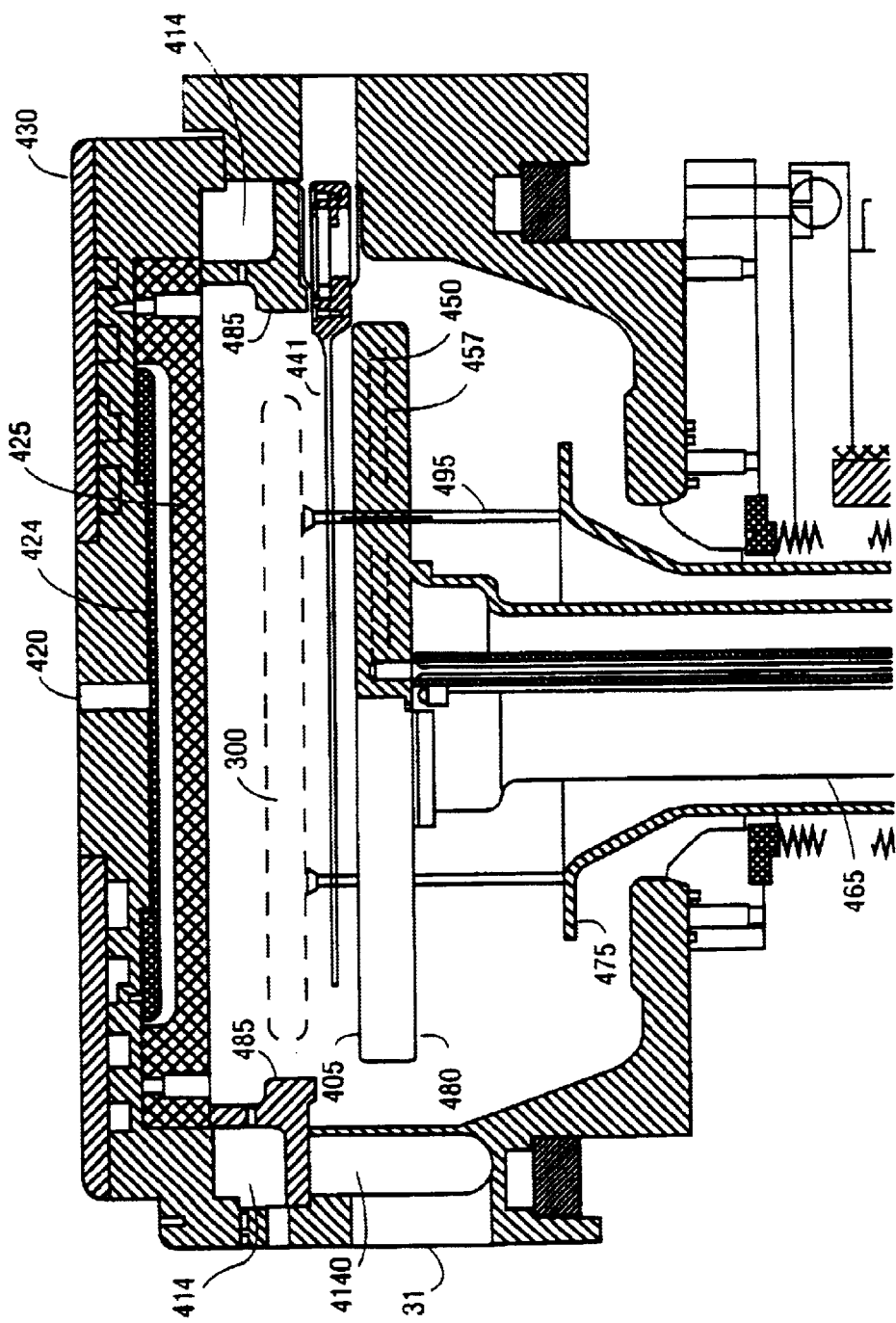
FIG. 5 shows an illustration of a similar cross-sectional sideview as in FIG. 4 in a "wafer load" position.
Figure 6:
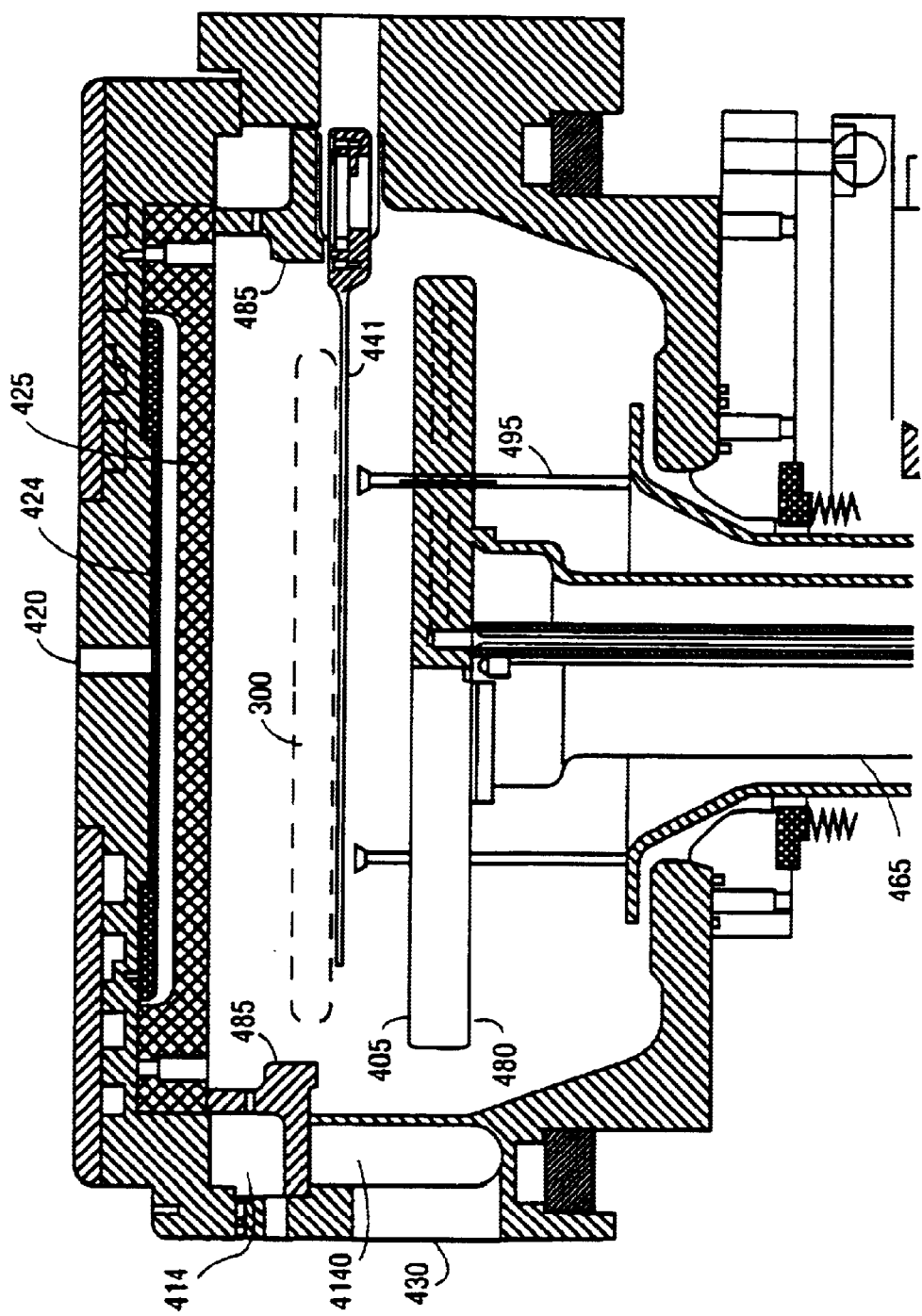
FIG. 6 shows an illustration of a similar cross-sectional sideview as in FIG. 4 in a "wafer separate" position.

FIGS. 4, 5, and 6 illustrate different cross-sectional side-views (e.g., wafer load position and wafer separate position) of a thermal low-pressure chemical vapor deposition chamber that can be used to practice the present invention. FIG. 4 illustrates the inside of process chamber body 445 in a "wafer-process" position. FIG. 5 shows the same view of the chamber in a "wafer-separate" position. FIG. 6 shows the same cross-sectional side view of the chamber in a "wafer-load" position. For the purpose of illustration, a chamber of approximately in the range of 5–6 liters is described.

FIGS. 4, 5, and 6 illustrate chamber body 445 that defines reaction chamber 490 in which process gases or reactant gases are thermally decomposed to form the silicon oxide film on the substrate 300. Chamber body 445 is constructed, in one embodiment, of aluminum and has passages 455 for water (or a mixture of water and ethylene glycol) to be pumped therethrough to cool chamber 445. The water passages enable the apparatus 400 to be a "cold-wall" reactor chamber. Chamber body 445 is also constructed of materials that will enable pressure in the chamber to be maintained between 0 to 350 Torr.

Resident in chamber 445 body 445 are chamber 490, chamber lid 430, distribution port 420, gas mixer 421, face plate (or shower head) 425, blocker plate 424, heater pocket 405, and resistive heater 480. Heater pocket 405 is positioned on resistive heater 480 and is further supported by shaft 465. Heater pocket 405 has a surface area sufficient to support substrate 300 such as a semiconductor wafer (shown in dashed lines). In one example, heater pocket 405 is a substrate holder for substrate 300. As will be apparent, heater pocket 405 also heats up substrate 300 during deposition. Chamber body 445 also houses lifter assembly 460, lift pins 495, and lift plate 475. Lift plate 475 is positioned at the base of chamber 490. Lift pins 495 extends and retracts through a plurality of through openings, through bores, or holes in the surface of heater pocket 405 to lift substrate 300 off heater pocket 405. As lift pins 495 retracts substrate 300 can be removed from chamber body 445. Chamber body 445 further receives transfer blade 441 which is a robotic mechanism used to insert substrate 300 through opening 440. Transfer blade 441 is positioned below the heads of lift pins 495 (see FIG. 5).

Chamber body 445 houses a lifter assembly 460. Lifter assembly 460 facilitates the moving of substrate 300 in and out of chamber 490. Lifter assembly 460 advances the heater 480 in an inferior direction (e.g., lowered) the position shown in FIG. 5 for inserting and removing substrate 300 in and out of chamber 490. Substrate 300 is placed into chamber through entry port 440 by for example, a robotic transfer mechanism that places substrate 300 on heater pocket 405. Robotic transfer mechanism includes transfer blade 441 which inserts the substrate through opening 440, beneath the heads of lift pins 495 which support substrate 300. Next, lifter assembly 460 moves (e.g., lowers) heater 480 and lifts plate 475 to a "wafer load" position. Lifter assembly 460 then moves heater 480 and lift pins 495 such that lift pins 495 extend through openings or through bores in a surface of heater pocket 405. Lift pins 495 extend in a cantilevered fashion from an inferior (e.g., lower) surface of heater pocket 405. Lift pins 495 then contact lift plate 475 which is positioned at the base of chamber 490. As substrate 300 is being loaded, heater 480 is lowered so that the surface of heater pocket 405 is below entry port 440 as shown in FIG. 6 so that substrate 300 can be placed into chamber 490. Once loaded, entry 440 is sealed and heater 480 is advanced in a superior (e.g., upward) direction toward face plate 425 by lifter assembly 460 that is, for example, a stepper motor. The advancement stops when the wafer 201 is a short distance (e.g., 400–700 mils) from faceplate 425 (see FIG.

4). As is illustrated in FIG. 5, in one embodiment, at the point, lift plate 475 remains at a wafer-process position (e.g., the same position of the plate as shown in FIG. 4). When substrate 300 is placed in chamber 490, heater pocket 405 and heater 480 heat substrate 300 to a desired processing temperature for the deposition process.

Substrate 300 can be removed from chamber 490 (for example, upon the completion of the deposition) first by being separated from the surface of heater pocket 405. Transfer blade 441 of a robotic mechanism is inserted through opening 440 beneath the heads of lift pins 495 which support substrate 300. Next, lifter assembly 460 moves (e.g., lowers) heater 480 and lifts plate 475 to a "wafer load" position. By moving lift plates 475 in an inferior direction, lift pins 495 are also moved in an inferior direction, until the surface of the processed wafer contacts the transfer blade. The processed substrate 300 is then removed through entry port 440 by, for example, a robotic transfer mechanism that removes substrate 300 and transfers the substrate to the next processing (e.g., cooling) step.

The mechanism described above may be repeated for subsequent substrate 300. A detailed description of one suitable lifter assembly 460 is described in U.S. Pat. No. 5,772,773, assigned to Applied Materials, Inc. of Santa Clara, Calif.

The temperature for film deposition inside chamber 490 is controlled by a resistive heater 480. Resistive heater 480 includes a first heating element 450 and a second heating element 457. Second heating element 457 is formed in a plane of the body of heater pocket 405 that is located inferior (relative to the surface of heater pocket in the figure) to first heating element 450. First heating element 450 and second heating element 457 are separately coupled to power terminals (not shown). The power terminals extend in an inferior direction as conductive leads through a longitudinally extending opening through shaft 465 to a power source that supplies the requisite energy to heat the surface of heater pocket 405.

Thermal LPCVD apparatus 400 also includes a temperature indicator (not shown) to monitor the processing temperature inside chamber 490. The temperature indicator can be positioned such that it conveniently provides data about the temperature at the surface of heater pocket 405 (or at the surface of a wafer on heater pocket 405). Also of note in the cross-section of heater 480 as shown in FIG. 4 is the presence of thermocouple 470. Thermocouple 470 extends through the longitudinally extending opening through shaft 465 to a point just below the superior or top surface of heater pocket 405.

Chamber body 445 further couples to a gas delivery system which delivers reactant gases, stabilization gases or cleaning gases to chamber 490. In one example, the gas delivery system includes gas panel system 401 which houses four manifolds, manifold 401a, manifold 401b, manifold 401c, and manifold 401d, each of which comprises gas lines (e.g., lines 1 to 11) for various gas sources that are injected into chamber 490. Gas sources are supplied into gas panel system 401 through various gas cylinders or containers and gas lines (not shown). Each of the manifolds includes mass flow controllers (MFC) that control the flow of the gas into chamber 409.

Manifold 401a pneumatically controls cleaning gases that are injected into chamber 490 after deposition process. For instance, after deposition process or between runs, chamber 490 is purged with the cleaning gases that are released from manifold 401. Manifold 401a also includes a exit line A which directs the cleaning gases (e.g., argon, nitrogen trifluoride, and N₂) into chamber 490.

Manifold 401b pneumatically controls the silicon source gases that are injected into chamber 490 during deposition. Examples of silicon source gases includes silane, disilane, methylsilane and halogenated silanes. The silicon source gases are sometimes carried into chamber 490 by a carrier gas (e.g., nitrogen, hydrogen, helium, argon, and xenon). Hence, there are several gas lines supplying different gases into manifold 401b. Manifold 401b also includes exit line B and exit line C in which, line B diverts the silicon source gases away from chamber 490 to the foreline and line C injects the silicon source gases into chamber 490. When the silicon source gases are carried by a carrier gas, these two gases are already mixed inside manifold 401b and together they exit via exit line C.

The diverting gas line (exit line B) and the carrier gas help ensure uniform distribution of the silicon source gases onto substrate 300 for deposition. Further, diverting the silicon source gas prevents fluctuation in the partial pressure of the silicon source gas in chamber 490 and maintains a constant flow in the silicon source gas. Diverting the silicon source gas away from chamber 490 also ensures that the flow reaches a constant flow rate prior to being injected into chamber 490. This will ensure uniform thickness in the deposited silicon oxide film.

Manifold 401c pneumatically controls the oxidation source gases that are injected into chamber 490 during deposition. Manifold 401a also includes a exit line D which directs the oxidation source gases (e.g., nitrous oxide, ozone, and tetraethoxysilane (TEOS)) into chamber 490. And, manifold 401d including exit line E pneumatically controls bottom purge gas (e.g., nitrogen) into the bottom of chamber 490 during deposition.

Chamber 445 also couples to a pressure regulator or regulators (not shown). The pressure regulators establish and maintain pressure in chamber 490. In one embodiment, for example, such pressure regulators are known in the field as baratron pressure regulator(s). The baratron pressure regulator(s) of the present invention maintains pressure at a level in the range of 50–350 Torr. In a preferred embodiment, the baratron pressure regulator(s) maintains pressure at 200 Torr.

Chamber 490 also couples to a gas out system through which gases are pumped out of the chamber. The gas outlet system includes pumping plate 485 which pumps residual process gases from chamber 490 to a collection vessel at a side of chamber body 445 (e.g., vacuum pump-out 431). Pumping plate 485 creates two flow regions resulting in a gas flow pattern that creates a uniform silicon layer on a substrate. In one example, vacuum pump-out 431 couples to pump 432 disposed exterior to chamber 490. In this example, pump-out 431 provides vacuum pressure within pumping channel 4140 (below channel 414 in FIGS. 4–6) to draw both the reactant and purge gases out of chamber 490 through vacuum pump-out 431. Pump 430 also draws the silicon source gas from exit gas line B to divert the silicon source gas away from chamber 490 when necessary.

In another example, vacuum pump-out 431 couples to a discharge conduit 433. Discharge conduit 433 discharges reactant gases, purging gases and residual gases from chamber 490. The flow rate of the discharge gas through channel 4140 is preferably controlled by a throttle valve 434 disposed along conduit 433.

Chamber 490 also includes sensors (not shown) which monitor the processing pressure within chamber 490. In one example, the cross-sectional area of discharge conduit 433 is varied to further facilitate the controlling of the processing pressure within chamber 490. Preferably, a controller or processor 900 coupled to chamber body 455 receives signals from the sensors that indicate the chamber pressure and adjusts throttle valve 43 accordingly to maintain the desired pressure within chamber 490. A suitable throttle valve for use with the present invention is described in U.S. Pat. No. 5,000,225 issued to Murdoch and assigned to Applied Materials, Inc. This is hereby incorporated by reference.

The materials for components in chamber 490 are selected such that the exposed components must be compatible with high temperature processing of the present invention. The thermal LPCVD processing of the present invention to form the silicon oxide film may involve heating temperature inside chamber 490 up to as high as 800° C. or even more. Such materials should also be compatible with the process gases and other chemicals, such as cleaning chemicals that may be introduced into chamber 490. In one embodiment, the exposed surfaces of heater 480 may be comprised of a variety of materials provided that the materials are compatible with the process. For example, heater pocket 405 and shaft 465 of heater 480 may be comprised of similar aluminum nitride material. Alternatively, the surface of heater pocket 405 may be comprised of high thermally conductive aluminum nitride materials (on the order of 95% purity with a thermal conductivity of 140 W/mK) while shaft 465 is comprised of a lower thermally conductive aluminum nitride. Heater pocket 405 of heater 480 is typically bonded to shaft 465 through diffusion bonding or brazing as such coupling will similarly withstand the environment of chamber 490.

Furthermore, FIG. 4 also shows a cross-section of a portion of heater 480, including a cross-section of the body of heater pocket 405 and a cross-section of shaft 465. In this illustration, FIG. 4 shows the body of heater pocket 405 having two heating elements formed therein, first heating element 450 and second heating element 457. Each heating element (e.g., heating element 450 and heating element 457) is made of a material with thermal expansion properties similar to the material of the heater pocket. A suitable material includes molybdenum (Mo). Each heating element includes a thin layer of molybdenum material in a coiled configuration.

Returning for a moment to FIG. 2, step 203 sets forth the next step in forming the silicon oxide film of the present invention, which is to obtain the desired processing temperature and pressure for the deposition process. It should be noted that chamber 490 may have already reached the desired process temperature and pressure prior to the placement of substrate 300 into chamber 490 as described above. However, after substrate 300 is deposited into chamber 490 on heater pocket 405, chamber 490 and heater pocket 405 must be allowed to equilibrate (e.g., reaching the desired process temperature and pressure) before the deposition process can begin to obtain optimal result. In one exemplary embodiment, 10 seconds is allotted to obtain the desired pressure and temperature. A carrier gas is also injected into chamber 490 during step 203 while temperature and pressure into chamber 490 are stabilizing. The carrier gas can be supplied through the manifold 401a described above. Examples of the carrier gas include nitrogen, helium, hydrogen, xenon and argon. In one embodiment, the carrier gas is fed into chamber 490 with a flow rate ranging from 500 sccm to 10000 sccm.

The desired process temperature for the deposition of the oxide film ranges from 400° C. to 900° C. In a preferred embodiment, chamber 490 maintains a process temperature sufficient to heat substrate 300 to 700° C. In another embodiment, the temperature at heater pocket 405 is between from 400° C. to 900° C. and is, preferably, at 700° C. such that substrate 300 is heated to the desired processing temperature. The desired process temperature varies depending on the type of the film being formed, the reactant gases used to form the film, and the desired pressure for the deposition process.

The temperature indicator is used to obtain the data about the temperature at the surface of heater pocket 405 or alternatively, at the surface of substrate 300 on heater pocket 405. It is to be appreciated that in the thermal LPCVD reactor 400 the temperature of the substrate 300 (typically, a wafer) may be about 20–30° cooler than the measured temperature of heater pocket 405. In one exemplary embodiment, the process temperature is based on the temperature measured from heater pocket 405.

The desired pressure for the deposition process is indicated by total pressure in chamber 490. In one exemplary embodiment, the desired pressure ranges from 50 Torr to 350 Torr and is, preferably, at 200 Torr throughout the deposition process. In one embodiment, the chamber is evacuated to a pressure between 50–350 Torr with 200 Torr being preferred.

It is preferred that while achieving pressure and temperature stabilization, a stabilization gas such as $N_2$, He, Ar, or combinations thereof is fed into chamber 490. In one example, manifold 401a releases the stabilization gas into chamber 490 with a flow rate ranging from 500 sccm to 10000 sccm.

In a preferred embodiment, processor controller 900 including system control software is able to control and adjust the processing temperature and pressure in chamber 490. In this embodiment, the processor controller adjusts the temperature by raising the heater's temperature between 700–740° C. while the stabilization gas (e.g., $N_2$, He, or Ar) is fed into chamber 490 at the desired flow rate. Additionally, the processor controller may also adjust the processing pressure in chamber 490 as necessary.

When the desired temperature and pressure are obtained, substrate 300 is now ready for deposition. In a preferred embodiment, substrate 300 is pretreated with an oxidation source gas. Step 204 of process 200 in FIG. 2 sets forth the pretreatment step in which the oxidation source gas (e.g., nitrous oxide, ozone, and tetraethoxysilane (TEOS)) is fed into chamber 490 for 3–10 seconds prior to the deposition of the oxide film. In one example, during the pretreatment step 204, the oxidation source gas is fed into chamber body 445 at a flow rate of 500–1500 sccm while the total pressure in chamber 490 is maintained at 200 Torr. In another example, the oxidation source gas is fed into chamber body 445 at a flow rate as high as 4000 sccm especially for formation of thick oxide films. The flow rate of the oxidation source gas that is fed into chamber 490 during the pretreatment step 204 of process 200 is the flow rate selected for the deposition of the oxide film.

Also during the pretreatment step 204 of process 200, the silicon source gas flow begins (e.g., silicon source gas leaves manifold 401b). In a preferred embodiment, the silicon source gas is already mixed with a carrier gas such as nitrogen. The flow rate for the silicon source gas is set at a desired flow rate that the silicon source gas is to be injected into chamber 490 for deposition. However, during the pretreatment step 204, exit line B is opened while exit line C is closed such that the silicon source gas is diverted away from chamber body 445 and especially chamber 490. The silicon source gas is diverted to vacuum pumpout 431. The diverting of the silicon source gas away from chamber 490 allows the silicon source gas to reach a constant desired flow rate before deposition begins. It is preferred that the silicon source gas reaches a constant flow rate between 1 sccm to 2 sccm before deposition is to begin. In alternative embodiments, other flow rates may be desirable, for example, where a thicker oxide film is desired, the flow rate needs to reach a constant flow of 4 sccm before deposition is to begin.

Still during the pretreatment step 204, the oxidation source gas is first released from manifold 401*a* into exit line A and enters chamber 490 through gas distribution point 420 which is positioned on the top surface of chamber lid 430. In one example, chamber lid 430 houses gas mixer 421. In that example, the oxidation source gas must also go through gas mixer 421 before being injected into chamber 490. The oxidation source gas then goes through blocker plate 424 to be distributed about an area consistent with the surface area of substrate 300. Thereafter, the oxidation source gas is distributed through perforated face plate 425 located, in this view, above resistive heater 480 and heater pocket 405 inside chamber 490. The combination of blocker plate 424 with face plate 425 in this embodiment creates a uniform distribution of the reactant gases at the substrate 300 (e.g., a wafer).

When the deposition site has been pretreated as in step 204, the next step is depositing the silicon oxide film. The discussion above and the following discussion focuses on the formation of a silicon oxide film, however, the present invention is not limited to silicon oxide film. For example, as will be apparent below, the present invention is also applicable to forming silicon oxynitride film. Step 206 sets forth the deposition step in the process flow 200. When ready for deposition, reactant gases (e.g., the silicon source gas and the oxidation (and nitridation, if oxynitride) source gas) controlled by gas panel 401 are flown into chamber 490 through mixer 421, gas distribution port 420, through blocker plate 424, and perforated face plate 425. At this point, exit line B is shut off directing the silicon source gas into chamber 490 through exit line C at the desired flow rate already achieved during step 204.

In a preferred embodiment, the silicon source gas is mixed with a carrier gas in manifold 401*b*. An exemplary carrier gas includes hydrogen, nitrogen, helium, xenon, or argon. The carrier gas is preferred because the amount of silicon source gas flowing into chamber 490 is small thus, the carrier gas will maximize uniform distribution of the silicon source gas over substrate 300. In this embodiment, the carrier gas has a flow rate between 5000 sccm to 10000 sccm while the silicon source gas has a flow rate between 1 sccm to 2 sccm. The flow rate for the silicon source gas can also be as high as 20 sccm with the carrier gas maintaining the flow rate between 5000 sccm to 10000 sccm. As mentioned above, the carrier gas and the silicon source gas are already mixed in manifold 401*b* prior to exiting exit line B or line C. For deposition, the silicon source gas and the carrier gas mixture will exit manifold 401*b* from exit line C.

The silicon source gas and the oxidation source gas each enters chamber 490, first, through separate exit lines. The silicon source gas first leaves manifold 401*b* through exit gas line C (note that at this point, exit gas line B is already shut off). The oxidation source gas first leaves manifold 401*c* through exit gas line D. In a preferred embodiment, the desired flow rate for each source gas is separately monitored and maintained. In a preferred embodiment, the silicon source gas and the oxidation source gas both enter gas mixer 421 at their respective desired flow rate prior to entering distribution point 420 and ultimately, chamber 490. Gas mixer 421 mixes the silicon source gas and the oxidation source gas before they are injected into chamber 490. The use of gas mixer 421 significantly improves thickness non-uniformity of the silicon oxide film. In another embodiment, gas mixer 421 is situation within chamber lid 430 so that the gas mixer is as close to substrate 300 as possibly can. In this embodiment, the mixture of the silicon and the oxidation source gases are released immediately above substrate 300.

The flow ratio for the silicon source gas and the oxidation (and nitridation, if oxynitride) source gas ranges from 1:50 to 1:10000, respectively. In a preferred embodiment, the flow rate for the silicon source gas is between 1 sccm to 2 sccm and the flow rate for the oxidation source gas is between 500 sccm to 1500 sccm. In another embodiment, the flow rate for the silicon source gas can be as high as 20 sccm and the flow rate for the oxidation source gas can be as high as 4000 sccm. There is thus, much more of the oxidation source gas than of the silicon source gas in chamber 490.

From distribution point 421, the reactant gases (e.g., the silicon source gas and the oxidation (and nitridation, if oxynitride) source gas) then go through blocker plate 424 to be distributed about an area consistent with the surface area of substrate 300. Thereafter, the reactant gases are distributed through perforated face plate 425 located, in this view, above resistive heater 480 and heater pocket 405. As mentioned, the combination of blocker plate 424 with face plate 425 in this embodiment is to create a uniform distribution of the reactant gases at the substrate, e.g., a wafer.

In one embodiment, the temperature inside chamber body 490 and at substrate 300 is maintained at a predetermined level sufficient to thermally decompose the reactant gases so that they form the silicon oxide film on substrate 300. In a preferred embodiment, substrate 300 has a temperature of 700° C. which is obtained by having the heater pocket 405 and heater 480 heating up substrate 300.

With the reactant gases injected into chamber 490 while the desired temperature and pressure are maintained constant, the reactant gases are thermally decomposed; the silicon and the oxygen intermediates react and form a silicon oxide film on the surface of substrate 300. Depending on the desired thickness of the silicon oxide film, the processing temperature and pressure, as well as the flow rates of all of the reactant gases, the deposition process may take 30 seconds to 90 seconds. The thickness of the silicon oxide film can thus be controlled by the time of deposition. (See Table 1 for exemplary deposition times for silicon oxide films of various thickness under certain processing parameters). Note that here is no external source of excitation such as plasma, photon, or catalysis necessary to facilitate the speed of the decomposition of the reactant gases.

During deposition, chamber 490 is effectively divided into two zones, a first chamber zone which is the zone above the superior surface of heater pocket 405 and a second chamber zone which is the zone below the inferior surface of heater pocket 405. It is generally desirable to confine the formation of the silicon oxide film to the first zone. Also during deposition, an inert bottom-purge gas, (e.g., nitrogen, argon, or helium) is introduced into the second chamber zone to inhibit film formation in that zone. The bottom-purge gas can be released from manifold 401*d* and injected into the bottom side of chamber 490.

In a preferred embodiment, when the deposition is complete, substrate 300 having the silicon oxide film deposited is post treated with an oxidation source gas (e.g., nitrous oxide) as set forth in step 208 of process 200 shown in FIG. 2. Similar to pre treatment step 204, the diverting gas line, exit gas line B, is turned back on which stops the flow of the silicon source gas into chamber 490. In this embodiment, only the oxidation source gas is fed into chamber 490 for about 10 seconds for post treating. Post treating terminates unreacted nitrous oxide site upon substrate 300. Post treating also minimizes film thickness non-uniformity and surface roughness for the silicon oxide film. However, post treating is not necessary and a good silicon oxide film can still be achieved with the methods described above. Diverting the silicon source gas maintains the constant flow rate and avoids the need to reestablish desired flow rate for the silicon source gas in the event that there are multiple substrates to be processed. Thus, consistent amount of the silicon source gas can be easily obtained from one process run to the next.

When the deposition is complete, chamber 490 may be purged as set forth in step 210 of process flow 200. Purging is accomplished by flowing, for example, an inert gas, such as nitrogen into chamber 490 for a predetermined amount of time. Purging may be done by releasing nitrogen from manifold 401a into chamber 490. Purging may also means cleaning chamber 490 with a cleaning gas. The cleaning gas can also be released from manifold 401a into chamber 490. If subsequent processing is necessary, purging should be done while the flow of the silicon source gas is diverted.

Upon the completion of the deposition, substrate 300 having the silicon oxide film deposited thereon is separated from the surface of heater pocket 405 according to the mechanism described above.

Figure 14:
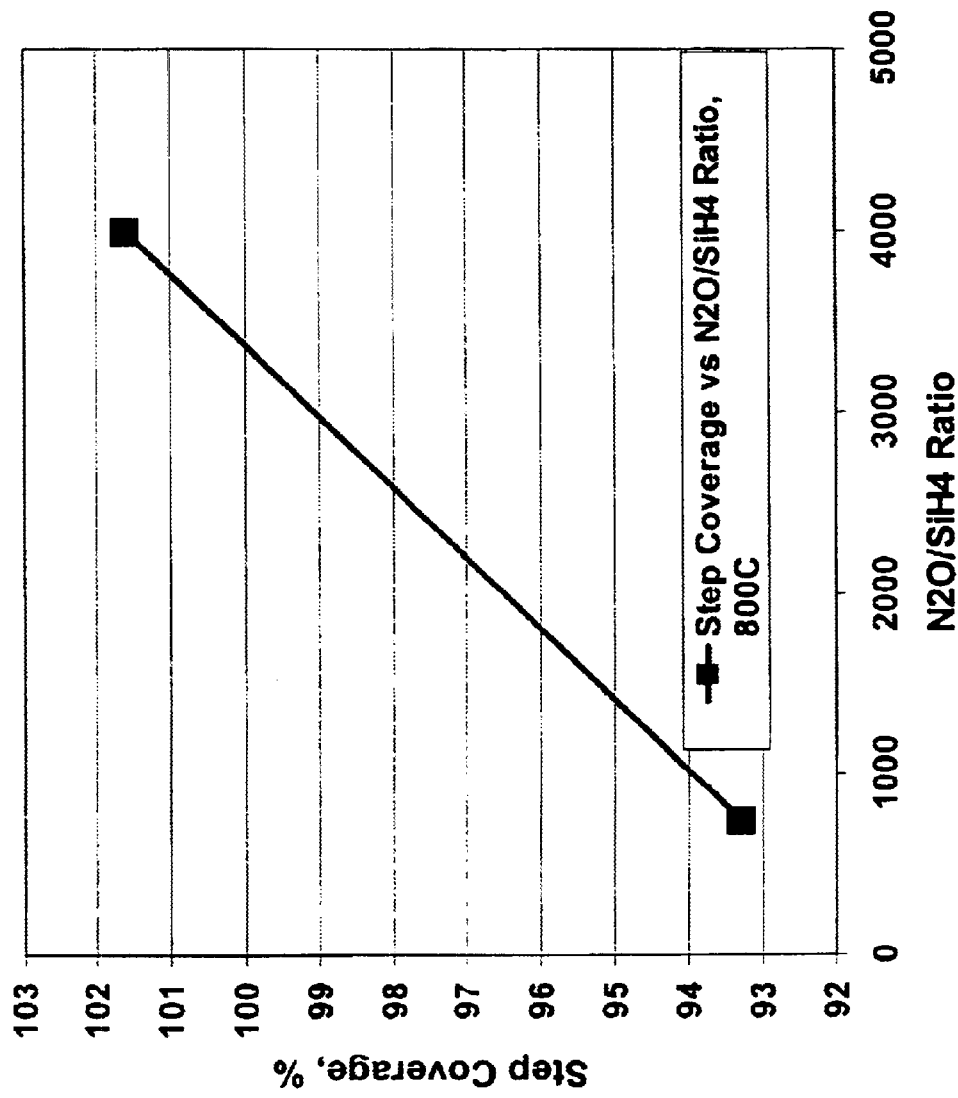
FIG. 14 illustrates an effect of the flow ratio of the oxidation source gas to the silicon source gas on the step coverage of the silicon oxide film formed according to the present invention
Figure 15:
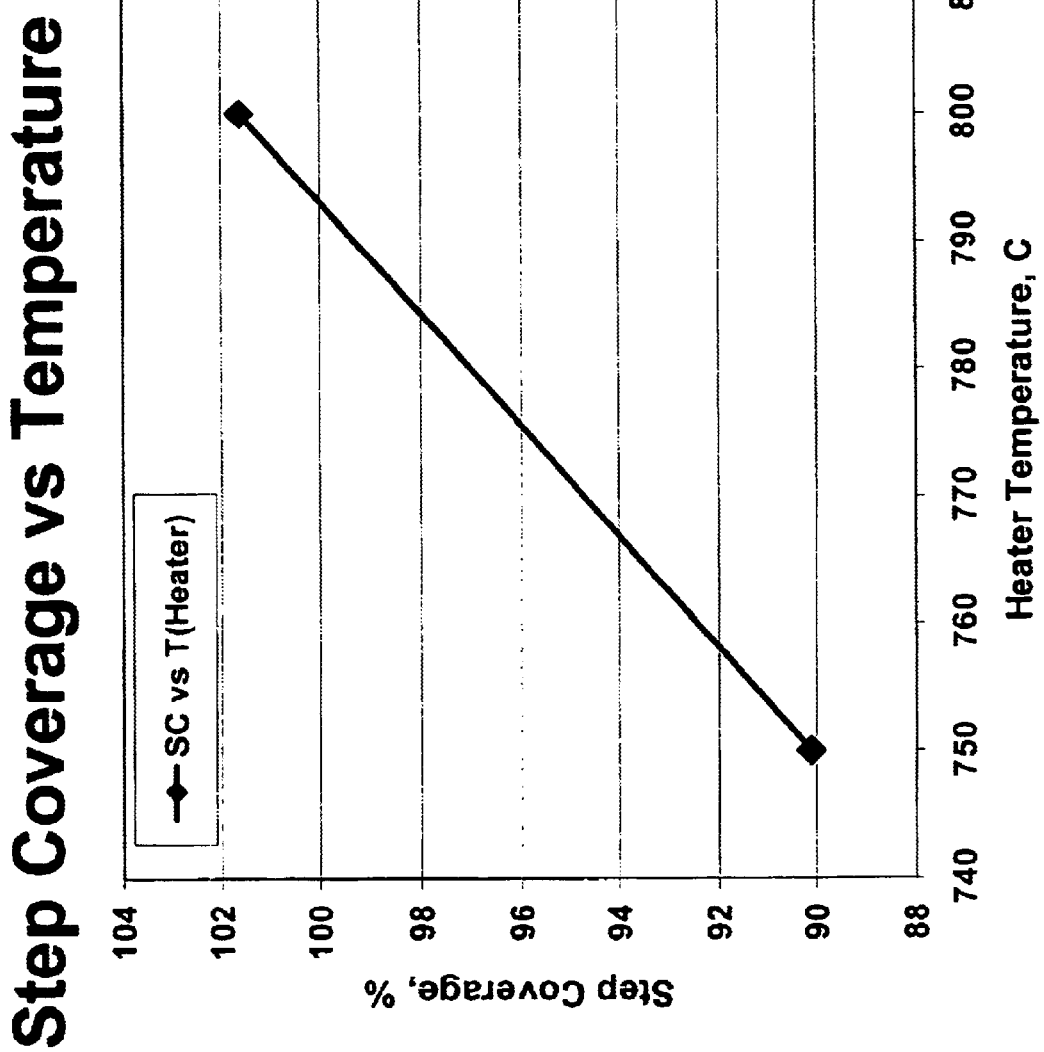
FIG. 15 illustrates an effect of heater temperature on the step coverage of the silicon oxide film formed according to the present invention Table 1 discuses exemplary parameters for making silicon oxide films.

Varying the process parameters such as the flow ratio of the silicon source gas and/or the oxidation source gas enables forming of silicon oxide films having adjustable etch rates. Varying the process parameters such as the flow ratio of the silicon source gas and/or the oxidation source gas, the deposition time, the deposition temperature, and the deposition pressure enables forming of silicon oxide films having an adjustable step coverage (physical coverage) and conformality (electrical and physical uniformity over the pattern). See for example, FIG. 14 which illustrates that increasing the flow ratio of $N_2O:SiH_4$ during the deposition process increases the step coverage of the silicon oxide film that is formed. As for another example, see FIG. 15 which illustrates that increasing the temperature for the deposition process increases the step coverage of the silicon oxide film that is formed.

Figure 3:
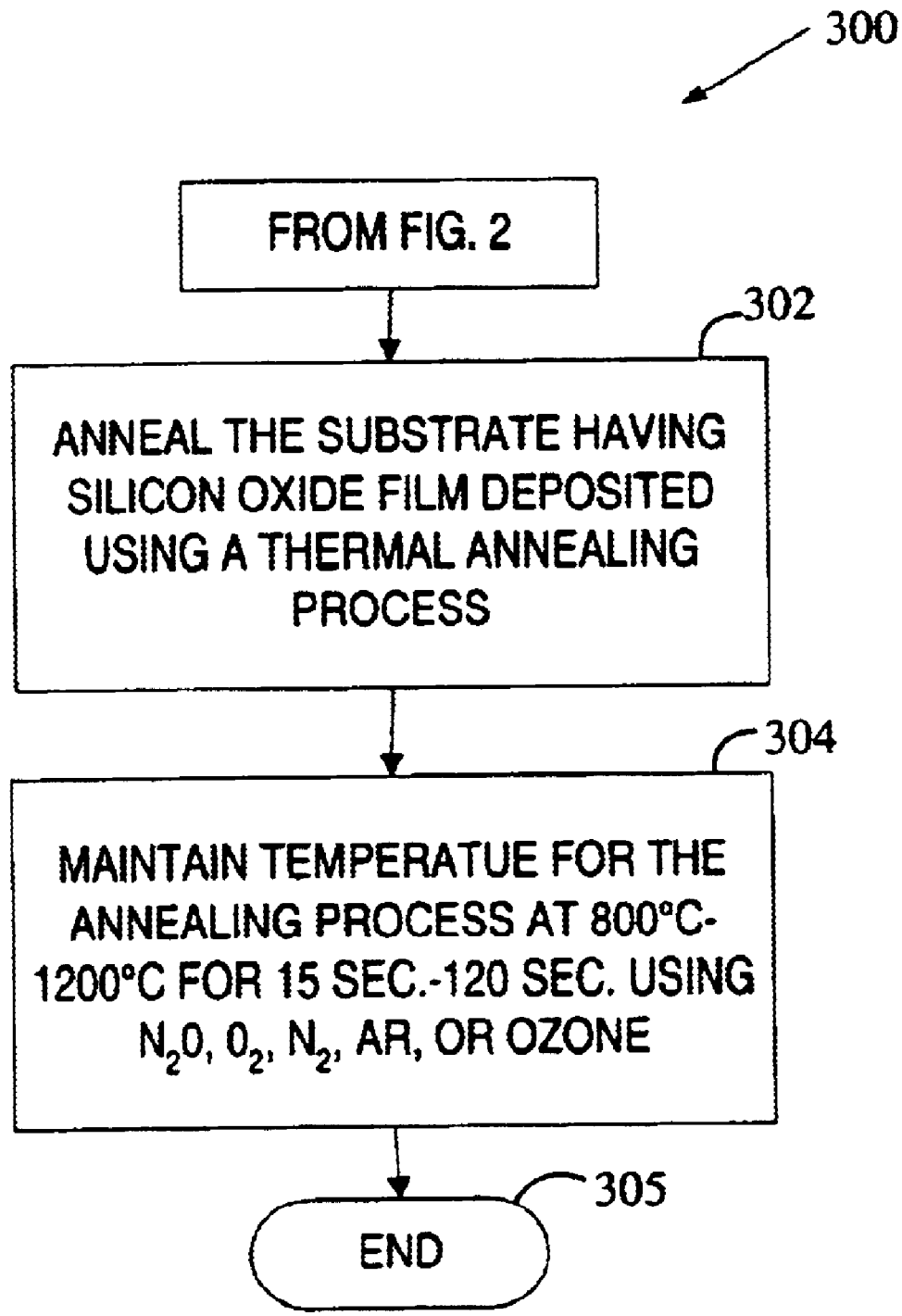
FIG. 3 shows a process flow of an exemplary annealing process of the present invention.

FIG. 3 illustrates the process flow of another exemplary method 300 of the present invention. In a preferred embodiment, the next step after deposition is annealing the substrate that has the silicon oxide film deposited thereon (see FIG. 3, step 302). The annealing step is not necessary for all oxide films. Annealing however may improve the resulting film as evidenced by superior etch properties compared to no annealing. Annealing the substrate according to the present embodiment is accomplished via a rapid thermal processing using a RTP system manufactured by Applied Materials, Inc. The deposited films are annealed in the RTP chamber by being heated up to temperatures ranging from 800° C. to 1200° C. for 15 to 120 seconds as set forth in step 304.

In a preferred method, the annealing source gas used is the same source gas that is used for the deposition, for example, if nitrous oxide is used as an oxidation source gas, then nitrous oxide is used as an annealing source gas. This way no new chemical is introduced into the silicon oxide film. Other annealing source gases include oxygen, nitrogen, argon, and ozone. In one example, the silicon oxide film is annealed in the RTP™ chamber in nitrous oxide at 900° C. for 60 seconds.

A silicon oxide film formed according to the exemplary methods discussed above has a growth rate ranging from 20 Å per minute to 2000 Å per minute. The silicon oxide film also has a thickness ranging from 10 Å to 3000 Å. The silicon oxide film has a wet-etch rate of about 129 Å per minute (wet etch in 100:1 HF for 60 seconds). Alternatively, when annealed in the RTP™ chamber in nitrous oxide, the silicon oxide film has a wet-etch rate of about 77 Å per minute (wet etch in 100:1 HF for 120 seconds). With no annealing, the wet etch rate of the silicon oxide film is about 211 Å per minute. Other properties of silicon oxide films formed under the methods discussed above include oxide films having non-uniformity below 1.2% (49 points, 3 mmEE, 1σ), controllable growth rate ranging from 30 Å per min to 2000 Å per min, tunable refractive index in the range of 1.43 to 1.47, and extremely low particle adders.

Figure 7:
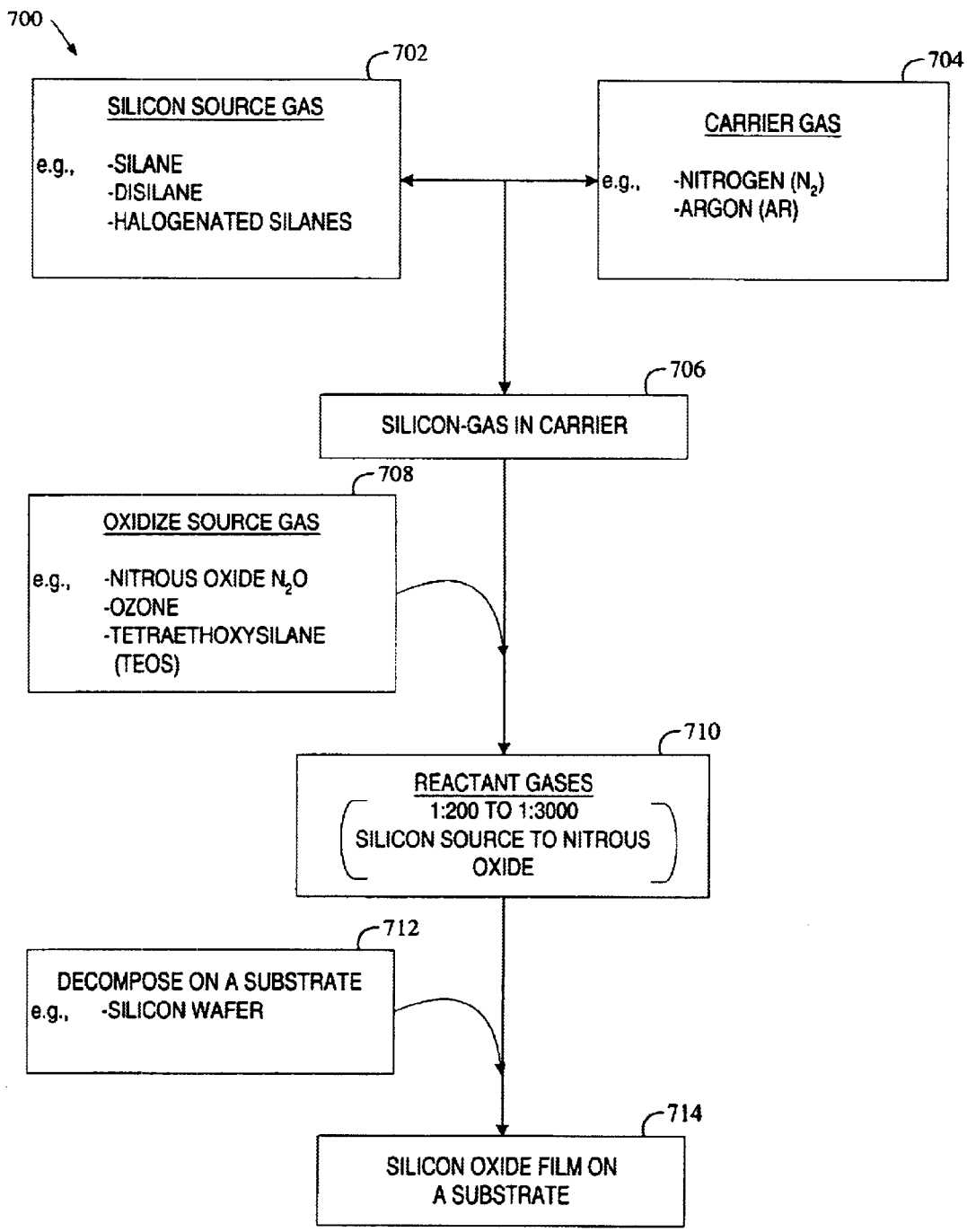
FIG. 7 shows an exemplary reaction step of forming a silicon oxide film on a substrate.

FIG. 7 summarizes the deposition of a silicon oxide film formed under the methods discussed above. A silicon source gas in box 702 is mixed with a carrier gas in box 704 which forms silicon source gas in carrier 706. The silicon source gas in carrier 706 is allowed to mix with an oxidation source gas 708 resulting in a mixture of reactant gases 710. The flow ratio for the silicon source gas to the oxidation source gas ranges from 1:50 to 1:10000. The reactant gases 710 are thermally decomposed upon a substrate in the deposition chamber as described above and a silicon oxide film is formed as depicted in boxes 712 and 714.

Table 1 illustrates exemplary parameters used for forming silicon oxide films of various thicknesses ranging from 60 Å to 1000 Å. It is to be appreciated that these parameters can be modified to create silicon oxide films having other thicknesses such as thicknesses ranging from 10 Å to 3000 Å. Section 1 indicates the thickness of the silicon oxide film being formed, e.g., a 60 Å silicon oxide film. Section 2 indicates the parameters for the pretreatment of substrate 300 prior to deposition. Section 3 indicates the deposition parameters. Section 4 indicates the post treatment parameters. And, section 5 indicates the purging parameters. Within each section, conditions listed include time for treatment, process temperature, process pressure, and flow rates for the gases that are used in the deposition. For illustration purpose, to form the 60 Å silicon oxide film, during the pretreatment, 500 sccm of Nitrous Oxide ($N_2O$) is fed into chamber 490; 1 sccm of silane ($SiH_4$) mixed with 5000 sccm of Nitrogen ($N_2$) carrier gas is diverted away from chamber 490. After 10 seconds of pretreatment, the silane gas in the nitrogen carrier are injected into chamber 490 at the same rate as the pretreatment (e.g., silane at 1 sccm and nitrogen at 5000 sccm). All other parameters remain the same. Forty seconds are allowed for the forming (deposition) of the silicon oxide film to achieve the 60 Å thick film. After deposition, the silane and the nitrogen carrier are once again diverted away from the chamber while the $N_2O$ continue to be flown into the chamber at 500 sccm for 10 seconds. This is referred to as post treatment. If purging is necessary, the carrier gas continues to be flown into the chamber. At all time an inert gas such as nitrogen is also introduced at 4000 sccm into the bottom side of chamber 490 for preventing deposition in bottom side of heater.

Figure 8:
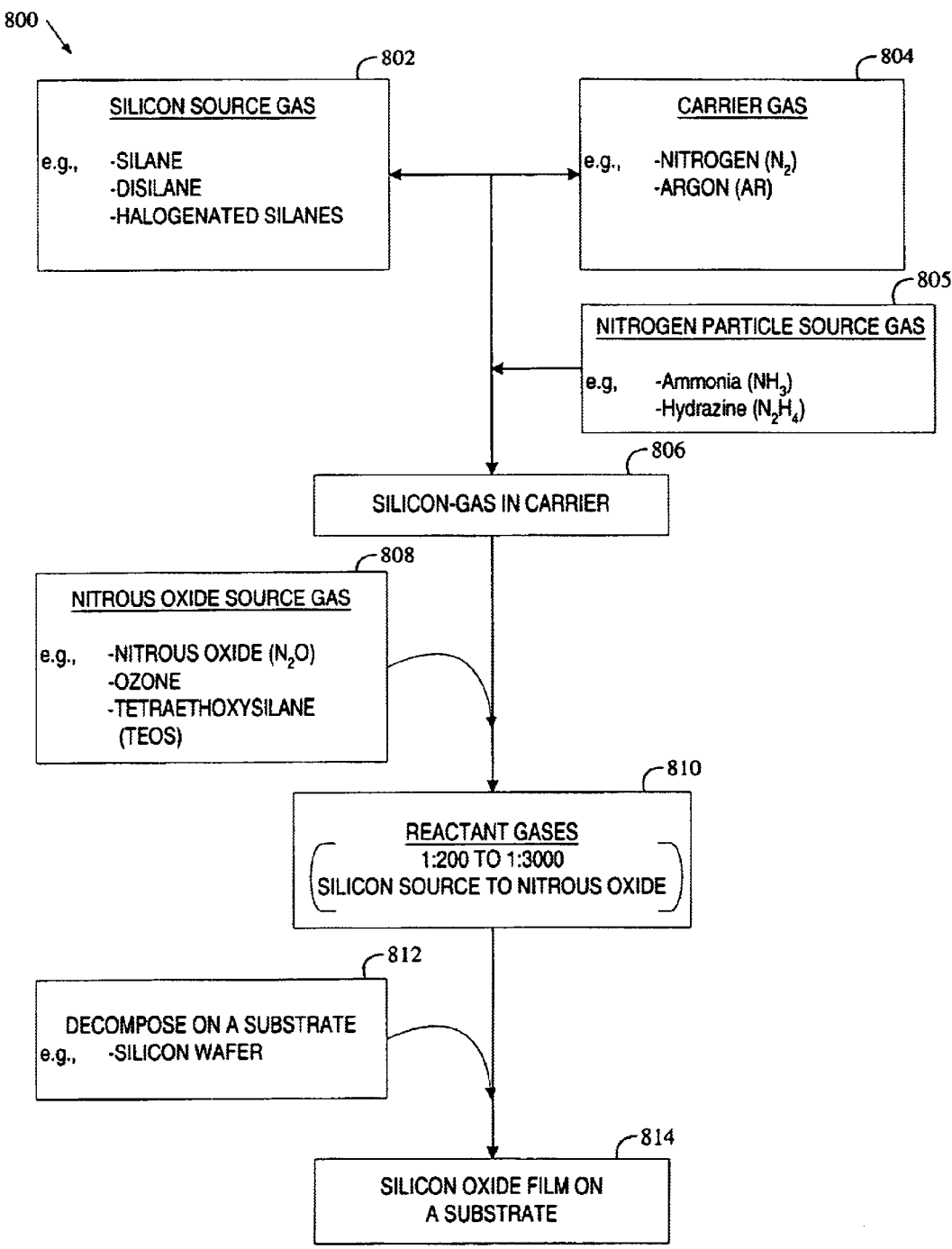
FIG. 8 shows an exemplary reaction step of forming a silicon oxynitride film on a substrate.

The methods discussed above can also be employed for deposition of other silicon films such as silicon oxynitride films. FIG. 8 illustrates an exemplary process of forming the silicon oxynitride film in which a silicon source gas 802 is mixed with a carrier gas 804 (e.g., hydrogen, nitrogen, argon, xenon, and helium) and a nitridation source gas 805, (e.g., ammonia ($NH_3$), and hydrazine ($N_2H_4$)). The silicon source gas in nitridation source gas (806) is then mixed with an oxidation source gas 808 forming reactant gases 810. The silicon source gas can be silane, disilane, or halogenated silane. The oxidation source gas can be oxygen, ozone, TEOS, or nitrous oxide.

In one embodiment, the substrate that the silicon oxynitride film is to be deposited is placed in chamber 490. Chamber 490 is then allowed to obtain the desired processing temperature and pressure just like described above. In one example, the desired processing temperature ranges from 400° C. to 800° C. and the processing pressure ranges from 50 Torr to 350 Torr.

The substrate is then pretreated with a source gas similar to step 204 of process 200 discussed above. In one example, the oxidation source gas, e.g., nitrous oxide, is fed into chamber 490 at a desired flow rate. One exemplary desired flow rate is a flow rate between 500 sccm to 1500 sccm. Similar to the deposition process for the silicon oxide film discussed above, during the pretreatment step, the silicon source gas is diverted away from chamber 490. This diversion of the silicon source gas is set at the desired flow rate for the deposition to allow the silicon source gas to achieve its desired flow rate and maintains a constant desired flow rate prior to deposition. In one example, the desired flow rate for the silicon source gas ranges from 1 sccm to 2 sccm. The pretreatment typically last 3–10 seconds.

Upon completion of the pretreatment, the substrate is ready for the deposition of the silicon oxynitride. The silicon source gas is injected into chamber 490 by having the exit gas line B for the diverting gas line shut off. At this time, the silicon source gas has already achieved its constant desired flow rate. Similar to the methods for forming the silicon oxide film, the silicon source gas plus the $NH_3$ or the $N_2H_4$ and the oxidation source gas are mixed in mixer 421 prior to being injected as a mixture into chamber 490. The reactant gases 810 have a flow ratio ranging form 1:50 to 1:10000 silicon source gas to oxidation (or nitridation) source gas.

Inside chamber 490, these source gases are thermally decomposed forming the silicon oxynitride film on the substrate. Again, there is not external source of excitation such as plasma, photon, or catalysis. The deposition process can then be completed according to the methods described for the silicon oxide film.

The deposition pressure, temperature, and reactant gases' flow rates and concentrations are chosen so that a silicon oxynitride film is deposited at a rate between 30 Å per minute to 3000 Å per minute with 50–100 Å per minute being preferred. A preferred growth rate for the silicon oxynitride film is 60 Å per minute. Similar to the deposition of the silicon oxide film, depending on the temperature, pressure, and concentration and or ratio of the reactant gases, the thickness of the film can be controlled by varying the time of deposition.

Similar to the deposition of the silicon oxide film, varying the process parameters such as the flow ratio of the silicon source gas, the nitridation source gas, and/or the oxidation source gas enables forming of silicon oxynitride films having an adjustable etch rate. Varying the process parameters such as the flow ratio of the silicon source gas, the nitridation source gas, the oxidation source gas, the deposition temperature, and/or the deposition pressure enables forming of silicon oxynitride films having an adjustable step coverage (physical coverage) and conformality (electrical and physical uniformity over the pattern).

Also, varying the process parameters such as the flow ratio of the silicon source gas, the nitridation source gas, the oxidation source gas, the deposition temperature, and/or the deposition pressure enables forming of silicon oxynitride films having adjustable optical properties (e.g., refractive index and extinction coefficient). Unlike the conventional furnace system (e.g., LPCVD system 100) or a plasma-CVD system, which are both restricted to low deposition pressure, the embodiments of the present invention is not restricted to low pressure or temperature. For instance, in the furnace system, increasing pressure will cause undesirable gas phase reaction. Furthermore, the silicon source gas and the oxidation source gas being introduced into the deposition chamber can be easily controlled changed and/or fine tuned during the deposition process.

Figure 11:
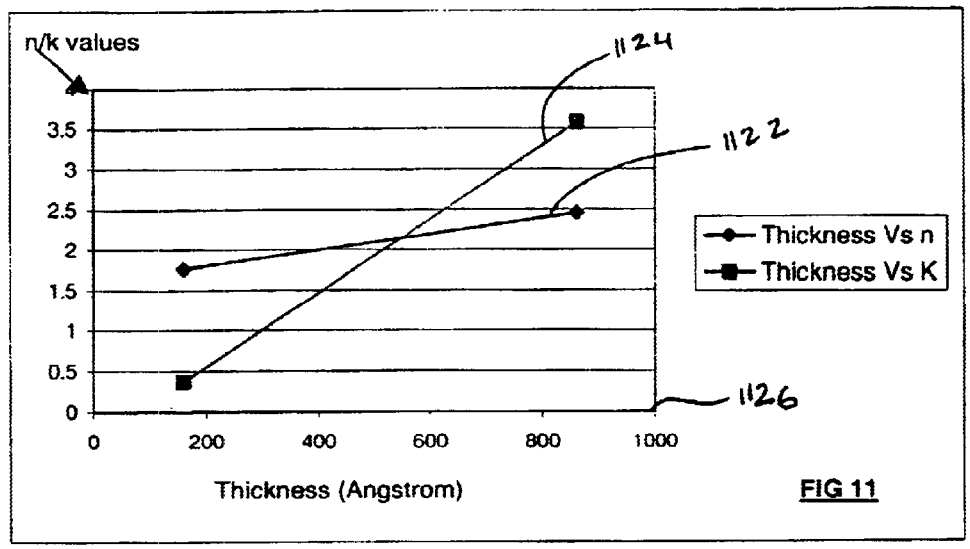
FIG. 11 illustrates a deposition time and thickness effect on the optical properties of the silicon oxynitride formed according to the present invention.

In one exemplary embodiment, the deposition time, which controls the thickness, is used to adjust the optical properties of the film which is expressed as the following equation, [Refractive index=$n(\lambda)+ik(\lambda)$]. The "n" stands for the refractive index; the "i" stands for an imaginary complex number; the "k" stands for an extinction coefficient; and the $\lambda$ stands for wavelength. As can be seen, adjusting the "n" and/or the "k" will result in different values for the refractive index. As illustrated by line 1122 of FIG. 11, as the thickness (represented by line 1126) increases, the refractive index (represented by line 1122) increases. Likewise, as illustrated by line 1104 of FIG. 11, as the thickness (represented by line 1126) increases, the extinction coefficient (represented by line 1124) increases. The increase in the thickness is controlled by the deposition time, for example, a deposition time of 180 seconds gives a thickness of 160 Å and a deposition time of 600 seconds gives a thickness of 860 Å.

Figure 12:
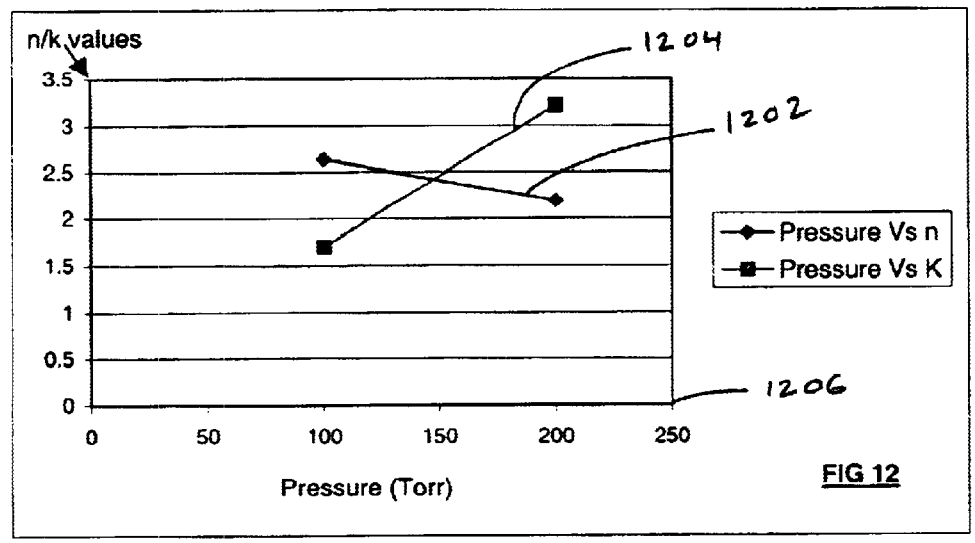
FIG. 12 illustrates a pressure effect on the optical properties of the silicon oxynitride formed according to the present invention.

In another exemplary embodiment, the deposition pressure is used to adjust the optical properties of the film. As illustrated by line 1202 of FIG. 12, as the pressure (represented by line 1206) increases, the refractive index (represented by line 1202) decreases. Conversely, as illustrated by line 1204 of FIG. 12, as the pressure (represented by line 1206) increases, the extinction coefficient (represented by line 1204) increases. The increase in the pressure also controls the thickness, for example, a pressure of 100 Torr gives a thickness of 568 Å and a pressure of 200 Torr gives a thickness of 835 Å.

Figure 13:
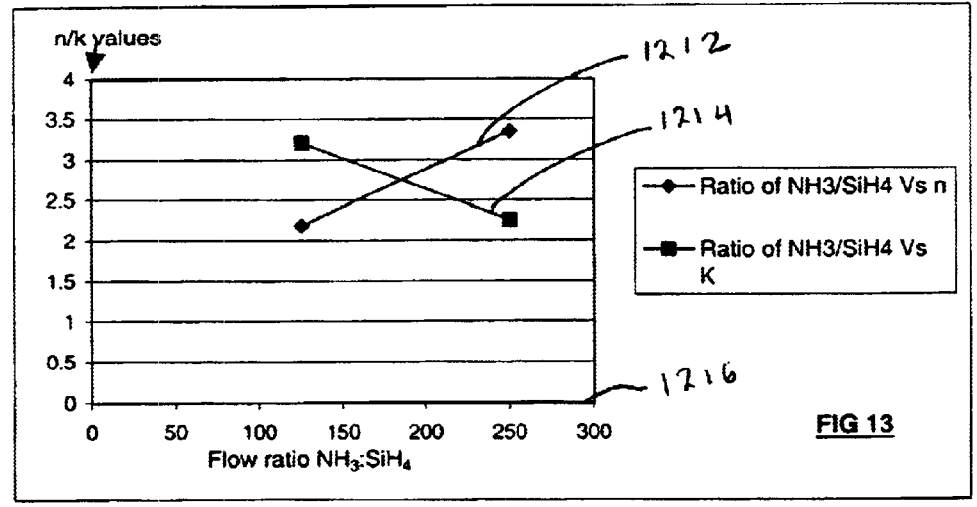
FIG. 13 illustrates an effect of the flow ratio of the silicon source gas and the nitridation source gas on the optical properties of the silicon oxynitride formed according to the present invention.

In yet another exemplary embodiment, the flow ratio of the nitridation source gas to the silicon source gas is used to adjust the optical properties of the film. As illustrated by line 1302 of FIG. 13, as the flow ratio (represented by line 1306) increases, the refractive index (represented by line 1302) increases. Conversely, as illustrated by line 1304 of FIG. 13, as the flow ratio (represented by line 1306) increases, the extinction coefficient (represented by line 1304) decreases. The increase in the flow ratio also controls the thickness of the silicon oxynitride, for example, a flow ratio of 125 ($NH_3$:$SiH_4$) gives a thickness of 835 Å and flow ratio of 250 ($NH_3$:$SiH_4$) gives a thickness of 453 Å. Thus, the thickness of the silicon oxynitride film can be an indication of the optical properties.

Figure 9:
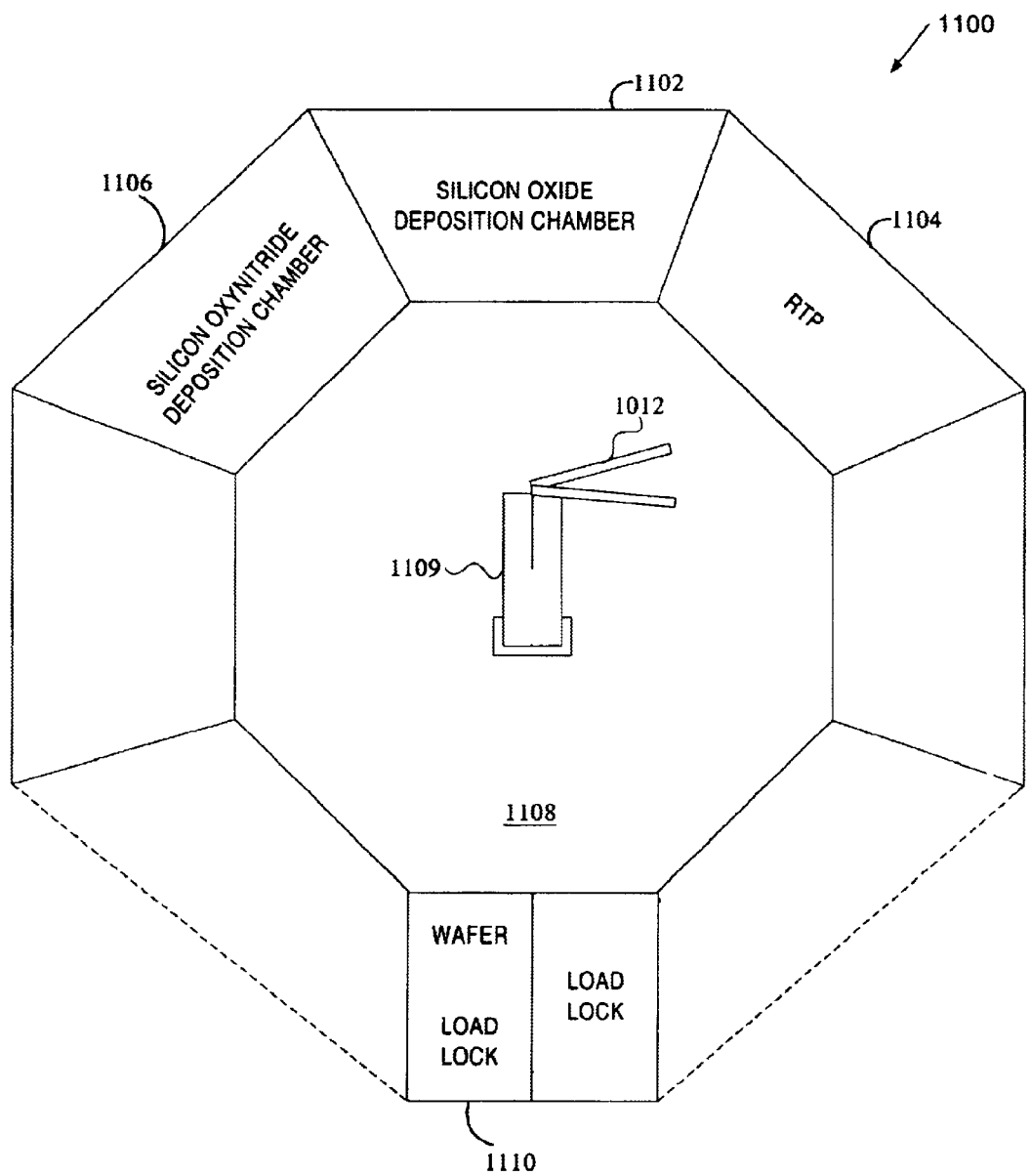
FIG. 9 shows an exemplary system that include multiple chambers for depositing oxide films and annealing the substrate having the oxide films deposited thereon.

FIG. 9 illustrates an exemplary cluster tool 1100 that includes several processing chambers. Cluster tool 1100 includes a silicon oxide deposition chamber 1102, a RTP chamber 1104, and a silicon oxynitride chamber deposition 1106. Each of the silicon oxide deposition chamber 1102 and the silicon oxynitride chamber deposition 1106 is much like the thermal LPCVD deposition chamber 400 described above. Cluster tool 1100 also includes a transfer chamber 1108 having a wafer handler 1009 (e.g., a robot), which is coupled to a robotic arm 1012 which couples to a transfer blade (not shown). The transfer blade is similar to the transfer blade 441 in FIG. 5 above. The transfer blade is used to deposit the wafer into one of the chambers mentioned above. Transfer chamber 1108 is further coupled to load lock system 1110, which stores the wafer substrates to be processed. In one example, the robot removes a substrate (e.g., a wafer) from load lock system 1110 and places it into appropriate chamber depending on a process protocol. Transfer chamber 1108 is typically set at a reduced pressure. Cluster tool 1100 is also set at a pressure that once the wafers are in the load lock system 1110, the operating conditions inside each chamber are not unaffected. When multiple processing is involved, for example, depositing the silicon oxide layer, depositing the silicon nitride layer, depositing the silicon oxide layer, and then annealing the substrate, cluster tool 1100 can be used to move the substrate from one chamber to the next chamber for each deposition step. For example, to deposit the silicon oxide film and anneal the substrate after the deposition, wafer handler 1009 removes the substrate from load lock 1110, places the substrate in chamber 1102 for the deposition of the silicon oxide film. Wafer handler 1009 then places removes the substrate from chamber 1102 and places the substrate into chamber 1104 for annealing.

The methods described above are used to fabricate devices having multiple silicon films. Such application includes the fabrication of an ONO (silicon oxide/silicon nitride/silicon oxide) stack for a flash memory gate in a transistor, an ONO spacer, a liner oxide trench, and side wall spacer in a MOS transistor, for instance.

An ONO stack is known as an interpoly dielectric layer acting as an insulation layer in an electronic device such as a transistor or a capacitor. All of the multiple silicon films can be formed "insitu" or in the same chamber (i.e., chamber 490). In this way, the silicon films are not exposed to an oxidizing ambient or to contaminants before the deposition of one film upon another film thereby enabling a clean interface to be achieved between the films. Alternatively, the films can be formed in multiple chambers, for instance, by using the cluster tool 1100 discussed in FIG. 9.

Figure 10A:
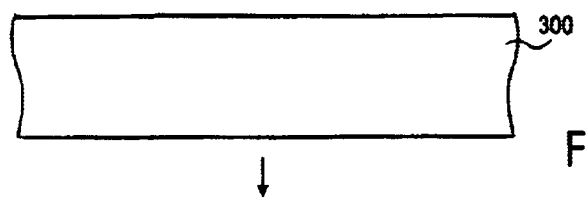
FIGS. 10A, 10B, 10C, 10D, 10E and 10F show an ONO spacer made according to some of the exemplary methods described in the present invention.
Figure 10B:
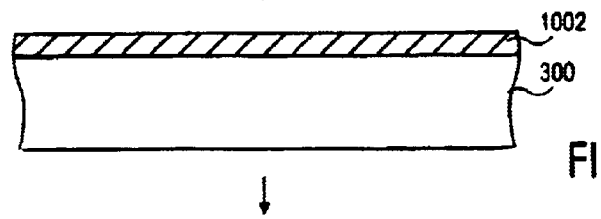

The methods described above can be used to form a spacer of an electronic device as illustrated in FIGS. 10A to 10F. The electronic device comprises substrate 300 which has a gate dielectric layer 1002 formed thereon as shown in FIGS. 10A and 10B. Substrate 300 can be a single crystalline silicon, a monocrystalline semiconductor wafer, or any other substrate used to form semiconductor devices. In these types of devices, substrate 300 will typically include isolation regions (not shown) such as LOCOS or shallow trench isolation (STI) regions to isolate the individual transistor formed in substrate 300 (not shown). The STI regions can be formed using the exemplary methods discussed above. In one example, where the electronic device is a transistor, the substrate 300 can be doped with impurities appropriate for either a p-type transistor or an n-type transistor. The gate dielectric 1002 can be made out of any suitable insulating material for semiconductor devices such as silicon dioxide, silicon oxynitride, or nitrided oxides. The gate dielectric 1002 can be deposited on substrate 300 by thermal oxidation well practiced in the art.

Figure 10C:
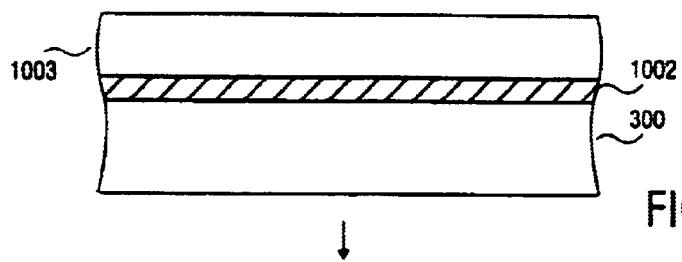
Figure 10D:
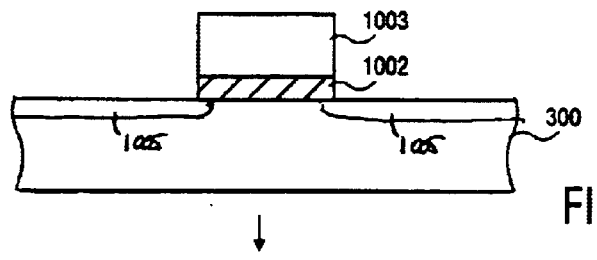
Figure 10E:
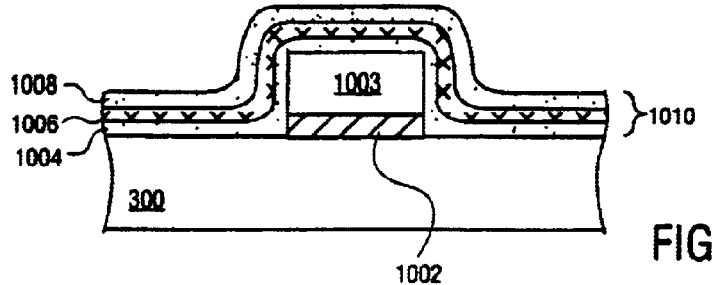
Figure 10F:
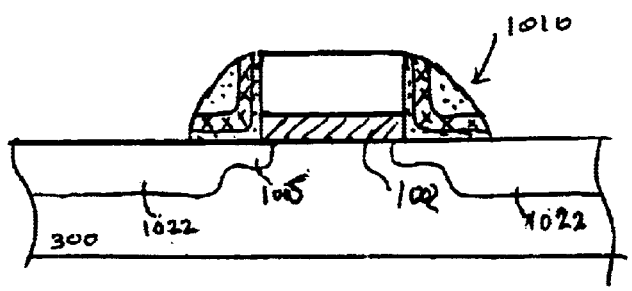

Next, as shown in FIG. 10C, a gate electrode film 1003 such as polysilicon is blanket deposited over gate dielectric 1002. Next, as shown in FIG. 10D, well known photolithography and etching techniques are used to pattern the films into a gate electrodes 1003 and gate dielectric 1002. If desired, at this time, well known doping techniques such as ion implantation can be used to form source/drain extension or tip regions 1005. FIG. 10E shows how the methods discussed above are applied to form a spacer for the electronic device. In this example, layer 1004 is a silicon oxide or silicon oxynitride film deposited (via blanket deposition) according to the methods discussed above. Layer 1006 is a silicon nitride film, also deposited according to the methods discussed above. And, layer 1008 is another silicon oxide or silicon oxynitride film deposited according to the methods discussed above. Each of the layers can be formed in separate chambers using cluster tool 1100 mentioned above or formed in situ in one chamber. Silicon oxide layers 1004 and 1008 can be formed with a silicon source gas (e.g., silane, disilane, and methylsilane) and an oxidation source gas (e.g., nitrous oxide) as reactant gases. Silicon nitride layer 1006 can be formed with a silicon source gas (e.g., silane, disilane, and methylsilane) and a nitridation source gas such as ammonia. No oxidation source gas is necessary. All of the layer 1004, 1006, and 1008 constitute an ONO stack 1010. The ONO stack 1010 formed according to the present invention may have different thickness in each layer depending on application. Depending on the temperature, pressure, and concentration and/or ratio of the reactant gases, the thickness for each of the films can be controlled by varying the time of deposition. The first silicon oxide layer 1004 and the second silicon dioxide layer 1008 can be each a high temperature film, a medium temperature, a low temperature film or any combination thereof. Next, the ONO stack 1010 can then be anisotropically etched using conventional methods to create spacers 1010 as shown in FIG. 10F. Spacers 1010 can then be used to space away an implant to form high doping and/or deep source/drain regions 1022.

Figure 10G:
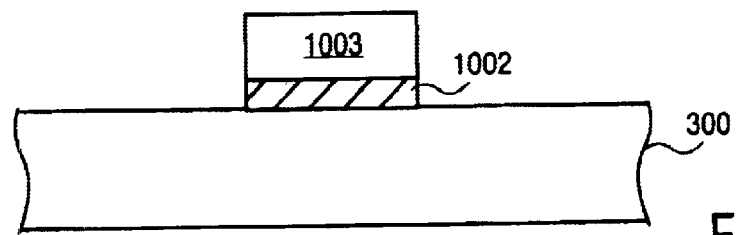
FIGS. 10G, 10H, and 10I show an exemplary flash memory device made according to some of the exemplary methods described in the present invention.
Figure 10H:
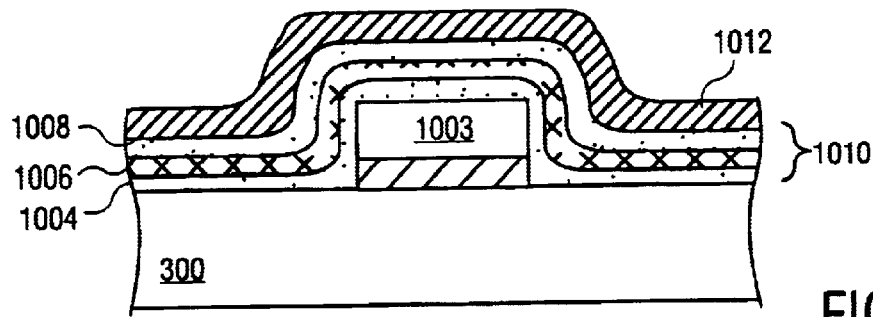
Figure 10I:
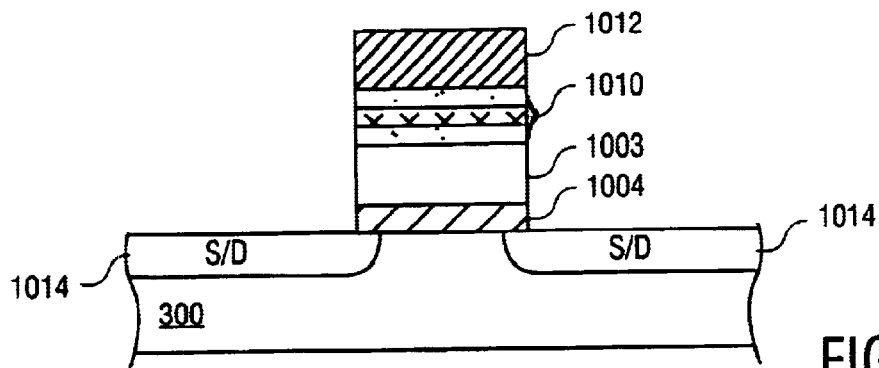

FIG. 10G shows an exemplary flash memory made using some of the method of the present invention. In this figure, substrate 300 includes a gate dielectric layer 1002 and gate electrode 1003 which is sometimes referred to as a floating gate electrode. Gate dielectric layer 1002 and gate electrode 1003 are formed using the same methods used for the previous example (FIGS. 10A to 10F discussion). ONO stack 1010 is then blanketly deposited as discussed above. Additionally, a control electrode 1012 (e.g., via chemical vapor deposition) is deposited over the ONO stack as shown in FIG. 10H. And, finally, masking, etching, and doping methods are used to form the flash memory device as shown in FIG. 10I.

Another application of the present invention relates to devices that may include multiple different types of small electronic devices within the same substrate. One such example is a complimentary metal oxide semiconductor (CMOS) device which includes both the p-type and the n-type transistors.

The present invention enables a low thermal budget for the deposition of oxide films. The thermal budget of the film described above is an order of magnitude lower than that of a film deposited using the convention furnace system 100 of the prior art. The methods of the present invention enable deposition of a single low temperate, medium temperature and high temperature film in a very short exposure time, 1–2 minutes, as compared to a conventional furnace system 100, which requires a couple of hours of exposure for deposition. Furthermore, the present invention enables deposition of low temperate, medium temperature or a high temperature film in a much higher total pressure than that of a conventional furnace system 100 of the prior art in which increasing pressure will result in undesirable gas phase reactions and reaction products. The present invention thus allows thermal deposition of silicon oxide film in a quick and efficient manner without any need of external source of excitation such as UV radiation, catalysis, or plasma excitation.

The present invention also yields uniform thickness and film properties from wafer to wafer. Because the deposition chamber is purged after each deposition to remove residual reactant gases the reactant gases are fresh and constant. There is no depletion effect as observed with the conventional furnace system 100.

Furthermore, the diverting of the silicon source gas ensures repeatability in the reactants concentration. Diverting the silicon source gas between wafer deposition ensures that oxide film thickness will be uniform while preventing any fluctuation in the silicon source gas flow. This enables the use of very minimal amount of silicon source gas while not compromising the partial pressure of this gas source in the deposition chamber, all in all, ensuring thickness uniformity between one wafer to another.

Referencing back to LPCVD apparatus 400 as shown in FIG. 4, apparatus 400 includes a processor/controller 900 and a memory 902, such as a hard disk drive. The processor/controller 900 includes a single board (SBC) analog and digital input/output boards, interface boards and stepper motor controller board. Processor/controller 900 controls all activity of the LPCVD chamber. The system controller executes system control software, which is a computer program stored in a computer readable medium such as memory 902. The computer program includes sets of instructions that dictate the timing, mixture of gases, chamber pressure, heater temperature, power supply, heater pocket position, and other parameters of the silicon oxide film or multi-film deposition process of the present invention. The computer program code can be written in any conventional computer readable programming language such as 68000 assembly language, C, C++, Pascal, Fortran, or others. Subroutines for carrying out process gas mixing, pressure control, and heater control are stored within memory 902. Also stored in memory 902 are process parameters such as process gas flow rates and compositions, temperatures, and pressures necessary to form a low temperature, medium temperature, or a high temperature film having a growth rate ranging from 20 A/minute to 2000 A/minute wherein a silicon source gas and a oxidation source gas are decomposed using a thermal energy source in a deposition chamber, wherein a total pressure for deposition process is ranging from 50 to 350 Torr, and wherein a ratio for said silicon source gas and said oxidation source gas ranges from of 1:50 to 1:10000 (silicon source gas to oxidation source gas) as described above. Thus, according to an embodiment the present invention LPCVD chamber 490 includes in memory 902 instructions and process parameters for: providing a silicon source gas and an oxidizer gas mix into chamber 490 wherein the silicon source gas is optionally released into chamber 490 with a carrier gas wherein the amount of the oxidation source gas is substantially greater than the amount of the silicon source gas (50:1 to 10000:1); for heating the heater pocket 405 to a temperature between 300–900° C.; and for generating a pressure between 50–350 Torr within chamber 490 so the silicon oxide film/the silicon oxynitride can be deposited by thermal chemical vapor deposition onto a substrate.

Thus, low temperature, medium temperature and high temperature silicon films and their methods of fabrication have been described.

TABLE 1

PARAMETERS FOR MAKING SILICON OXIDE FILMS

| 1 | | 60 Å Silicon oxide film | 70 Å Silicon oxide film | 150 Å Silicon oxide film | 1000 Å Silicon oxide film |
|---|---|---|---|---|---|
| 2 | Pretreatment | | | | |
| | Time | 10 seconds | 10 seconds | 10 seconds | 10 seconds |
| | Temperature | 750° C. | 800° C. | 700° C. | 800° C. |
| | Pressure | 200 Torr | 200 Torr | 200 Torr | 200 Torr |
| | $N_2O$ into chamber | 500 sccm | 1200 sccm | 1500 sccm | 4000 sccm |
| | $SiH_4$ divert line | 1 sccm | 2 sccm | 2 sccm | 20 sccm |
| | $SiH_4$ into chamber | 0 sccm | 0 sccm | 0 sccm | 0 sccm |
| | $N_2$ into chamber (carrier for $SiH_4$) | 5000 sccm | 10000 sccm | 5000 sccm | 10000 sccm |
| | $N_2$ into bottom chamber | 4000 sccm | 8000 sccm | 4000 sccm | 8000 sccm |
| 3 | Deposition | | | | |
| | Time | 40 seconds | 44 seconds | 53.2 seconds | 75 seconds |
| | Temperature | 750° C. | 800° C. | 750° C. | 750° C. |
| | Pressure | 200 Torr | 200 Torr | 200 Torr | 200 Torr |
| | $N_2O$ into chamber | 500 sccm | 1200 sccm | 1500 sccm | 4000 sccm |
| | $SiH_4$ divert line | 0 sccm | 0 sccm | 0 sccm | 0 sccm |
| | $SiH_4$ into chamber | 1 sccm | 2 sccm | 2 sccm | 20 sccm |
| | $N_2$ into chamber (carrier for $SiH_4$) | 5000 sccm | 10000 sccm | 5000 sccm | 10000 sccm |
| | $N_2$ into bottom chamber | 4000 sccm | 8000 sccm | 4000 sccm | 8000 sccm |
| 4 | Posttreatment | | | | |
| | Time | 10 seconds | 10 seconds | 10 seconds | 10 seconds |
| | Temperature | 750° C. | 800° C. | 750° C. | 750° C. |
| | Pressure | 200 Torr | 200 Torr | 200 Torr | 200 Torr |
| | $N_2O$ into chamber | 500 sccm | 1200 sccm | 1500 sccm | 4000 sccm |
| | $SiH_4$ divert line | 0 sccm | 2 sccm | 0 sccm | 0 sccm |
| | $SiH_4$ into chamber | 0 sccm | 0 sccm | 0 sccm | 0 sccm |
| | $N_2$ into chamber (carrier for $SiH_4$) | 5000 sccm | 10000 sccm | 5000 sccm | 10000 sccm |

TABLE 1-continued

PARAMETERS FOR MAKING SILICON OXIDE FILMS

| | 60 Å Silicon oxide film | 70 Å Silicon oxide film | 150 Å Silicon oxide film | 1000 Å Silicon oxide film |
|---|---|---|---|---|
| $N_2$ into bottom chamber | 4000 sccm | 8000 sccm | 4000 sccm | 8000 sccm |
| Purge Time | 10 seconds | 10 seconds | 10 seconds | 10 seconds |
| $N_2$ into chamber (carrier for $SiH_4$) | 5000 sccm | 10000 sccm | 5000 sccm | 10000 sccm |
| $N_2$ into bottom chamber | 4000 sccm | 8000 sccm | 4000 sccm | 8000 sccm |

We claim:

1. A method of forming a silicon oxynitride film including:

placing a substrate in a deposition chamber and obtaining a desired process temperature and a desired process pressure;

flowing an oxidation source gas into said deposition chamber at a first desired flow rate for a first predetermined amount of time after said desired process temperature and said desired process pressure are obtained;

diverting a silicon source gas away from said deposition chamber, said diverting having said silicon source gas flow at a second desired flow rate and said diverting occurring before forming said silicon oxynitride film;

stopping said diverting and flowing said silicon source gas at said second desired flow rate into said deposition chamber;

decomposing said silicon source gas and said oxidation source gas in said deposition chamber using a thermal energy source;

forming said silicon oxynitride film above said substrate wherein said desired process pressure is between of 50 to 350 Torr, wherein said desired process temperature is between 400° to 800° C., and wherein a flow ratio for said silicon source gas and said oxidation source gas is between 1:50 to 1:10000;

wherein said silicon source gas is mixed with a nitridation source gas;

terminating said silicon source gas into said deposition chamber while maintaining said flowing of said oxidation source gas in said deposition chamber for a second predetermined amount of time; and purging said deposition chamber with a cleaning gas.

2. A method as in claim 1 wherein said silicon source gas is selected from the group consisting of silane, disilane, methylsilane, and halogenated silanes.

3. A method as in claim 1 further including mixing said silicon source gas with said oxidation source gas prior to said forming of said silicon oxynitride film.

4. A method as in claim 1 wherein said oxidation source gas is selected from the group consisting of nitrous oxide, ozone, and TEOS.

5. A hod as in claim 1 wherein said nitrogen source gas is selected from the group consisting of an ammonium source gas, ammonia, and hydrazine.

6. A process of forming an oxide film including:

depositing a substrate in a deposition chamber, said deposition chamber designed such that thermal low-pressure chemical vapor deposition process is utilized to form said oxide film on said substrate said deposition chamber further includes a water passage to create a cold wall deposition chamber, a resistively heated heater pocket to heat up said substrate wherein said substrate is horizontally placed on said heater pocket and a gas distribution point for injecting reactant gases into said deposition chamber;

flowing a silicon source gas and an oxidation source gas into said distribution point wherein said distribution point is located above said resistively heated heater pocket;

decomposing said silicon source gas and said oxidation source gas using a thermal energy source from said deposition chamber; and forming said oxide film on said substrate.

7. A method as in claim 6 wherein said silicon source gas is selected from the group consisting of silane, disilane, methylsilane, and halogenated silanes.

8. A method as in claim 6 further including mixing said silicon source gas with said oxidation source gas prior to said forming of said silicon oxynitride film.

9. A method as in claim 6 wherein said oxidation source gas is selected from the group consisting of nitrous oxide, ozone, and TEOS.

10. A method as in claim 6 wherein said nitrogen source gas is selected from the group consisting of an ammonium source gas, ammonia, and hydrazine.

* * * * *